(12) United States Patent
Sasajima et al.

(10) Patent No.: US 9,837,262 B2
(45) Date of Patent: *Dec. 5, 2017

(54) METHOD OF MANUFACTURING A SIOCN FILM, SUBSTRATE PROCESSING APPARATUS AND RECORDING MEDIUM

(71) Applicant: HITACHI KOKUSAI ELECTRIC INC., Tokyo (JP)

(72) Inventors: Ryota Sasajima, Toyama (JP); Yoshinobu Nakamura, Toyama (JP)

(73) Assignee: Hitachi Kokusai Electric, Inc., Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 15/202,168

(22) Filed: Jul. 5, 2016

(65) Prior Publication Data

US 2016/0314959 A1     Oct. 27, 2016

Related U.S. Application Data

(63) Continuation of application No. 14/725,865, filed on May 29, 2015, now Pat. No. 9,412,585, which is a continuation of application No. 14/026,238, filed on Sep. 13, 2013, now Pat. No. 9,263,253.

(30) Foreign Application Priority Data

Sep. 18, 2012   (JP) ................. 2012-205073

(51) Int. Cl.
| | | |
|---|---|---|
| *H01L 21/02* | (2006.01) | |
| *C23C 16/30* | (2006.01) | |
| *C23C 16/455* | (2006.01) | |
| *C23C 16/52* | (2006.01) | |

(52) U.S. Cl.
CPC ......... *H01L 21/0214* (2013.01); *C23C 16/30* (2013.01); *C23C 16/45531* (2013.01); *C23C 16/45544* (2013.01); *C23C 16/52* (2013.01); *H01L 21/0228* (2013.01); *H01L 21/02126* (2013.01); *H01L 21/02211* (2013.01)

(58) Field of Classification Search
CPC ........... H01L 21/0228; H01L 21/02126; H01L 21/0214; H01L 21/02211; C23C 16/30; C23C 16/45531; C23C 16/45544; C23C 16/52

See application file for complete search history.

(56) References Cited

U.S. PATENT DOCUMENTS

| | | |
|---|---|---|
| 2011/0256733 A1 | 10/2011 | Hirose et al. |
| 2011/0294280 A1 | 12/2011 | Takasawa et al. |
| 2012/0184110 A1 | 7/2012 | Hirose et al. |

FOREIGN PATENT DOCUMENTS

JP         2011-238894 A     11/2011

*Primary Examiner* — Charles Garber
*Assistant Examiner* — Brigitte Paterson
(74) *Attorney, Agent, or Firm* — Volpe and Koenig, P.C.

(57) ABSTRACT

A method of manufacturing a semiconductor device includes forming a thin film containing a predetermined element, oxygen, carbon, and nitrogen on a substrate by performing a cycle a predetermined number of times after supplying a nitriding gas to the substrate. The cycle includes performing the following steps in the following order: supplying a carbon-containing gas to the substrate; supplying a predetermined element-containing gas to the substrate; supplying the carbon-containing gas to the substrate; supplying an oxidizing gas to the substrate; and supplying the nitriding gas to the substrate.

11 Claims, 11 Drawing Sheets

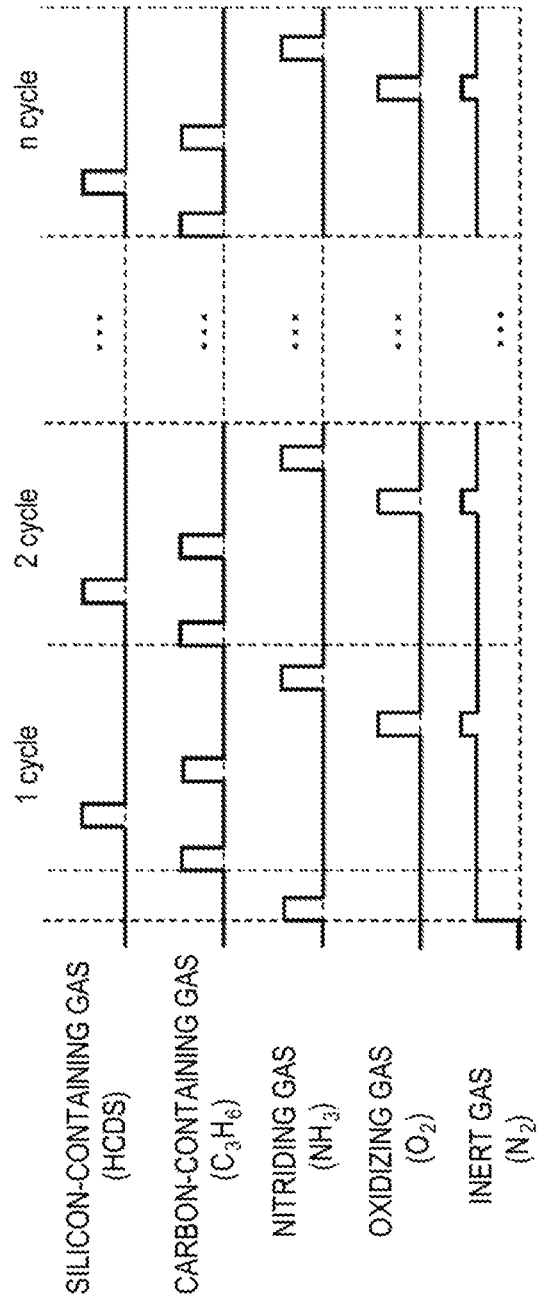

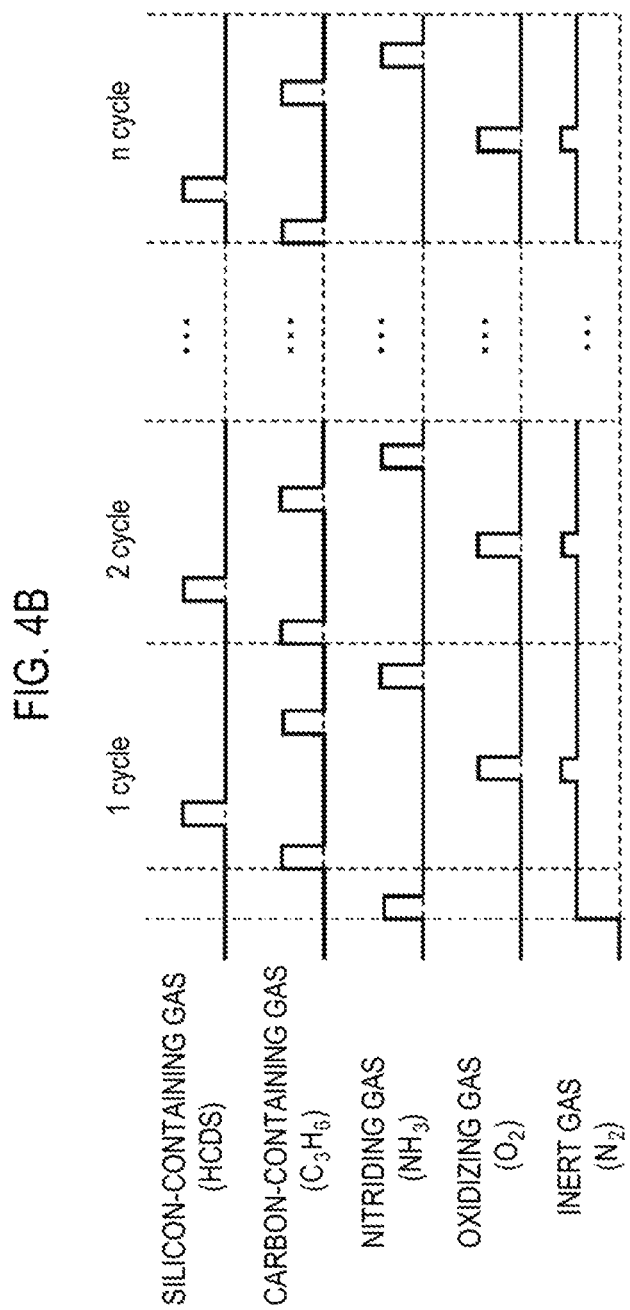

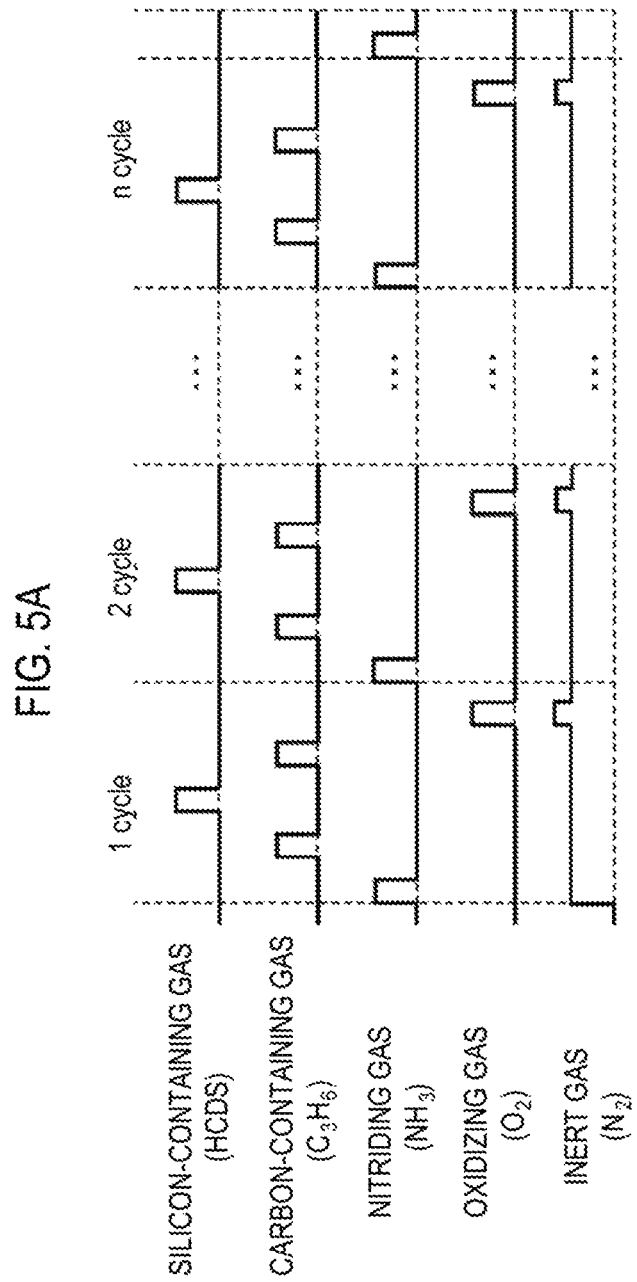

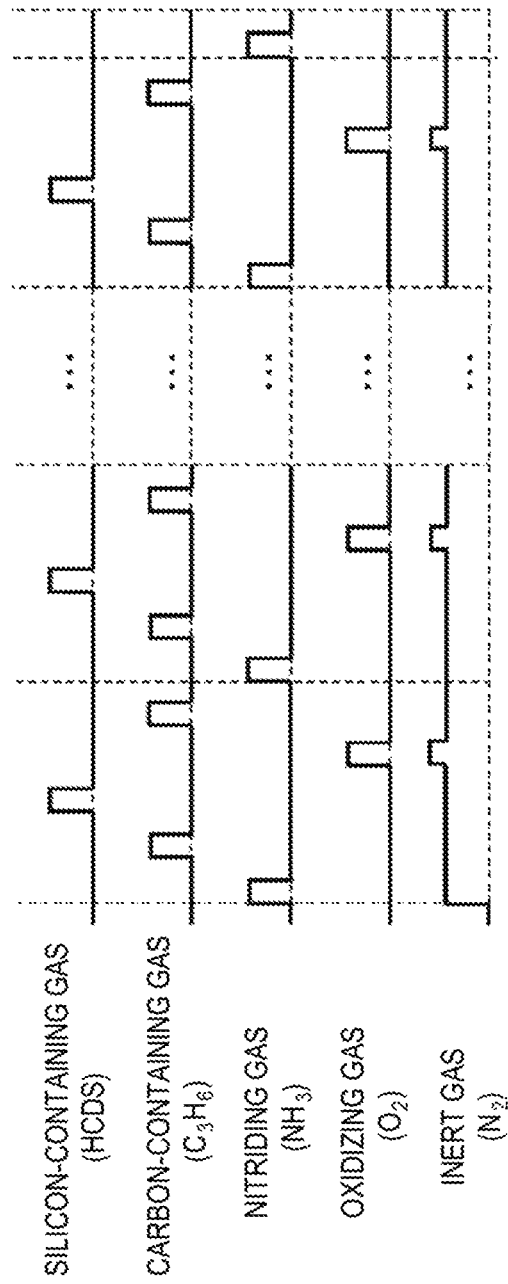

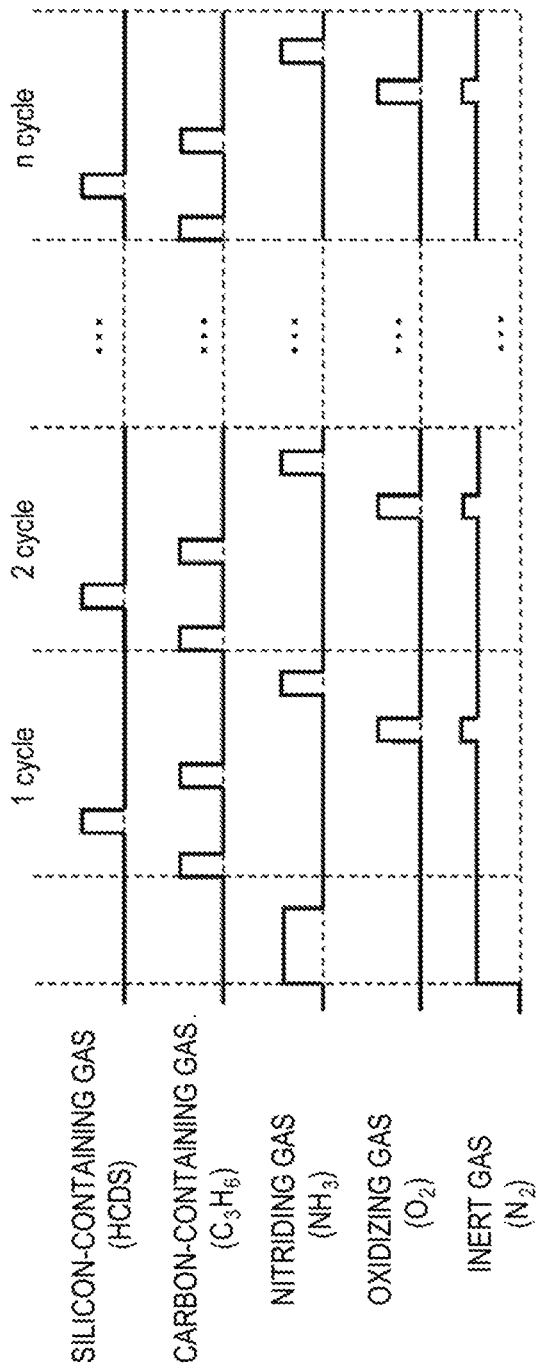

METHOD OF MANUFACTURING A SIOCN FILM, SUBSTRATE PROCESSING APPARATUS AND RECORDING MEDIUM

CROSS-REFERENCE TO RELATED APPLICATIONS

This application is a continuation of U.S. patent application Ser. No. 14/725,865, filed May 29, 2015, which is a continuation of U.S. patent application Ser. No. 14/026,238, filed Sep. 13, 2013, which is based upon and claims the benefit of priority from Japanese Patent Application No. 2012-205073, filed on Sep. 18, 2012, the entire contents of which are incorporated herein by reference.

TECHNICAL FIELD

The present disclosure relates to a method of manufacturing a semiconductor device which includes a process of forming a thin film on a substrate, a substrate processing apparatus, and a recording medium.

BACKGROUND

As semiconductor devices are miniaturized in size, the demand for reducing a parasitic capacitance between a gate and a source of a transistor is increasing. For this reason, a film (e.g., a low-k film) having a relatively lower dielectric constant is considered in manufacturing semiconductor devices, instead of a silicon nitride film (i.e., $Si_xN_y$ film, hereinafter, simply referred to as "SiN film"), which is conventionally used as a sidewall film or the like. In a silicon oxycarbonitride film (SiOCN film) in which oxygen (O) and carbon (C) are added to the SiN film, a low dielectric constant is realized by adding O, and a wet etching resistance or a dry etching resistance which is deteriorated by adding O can be recovered or improved by adding C.

It is known that the SiOCN film, which is a thin film containing a predetermined element such as silicon, oxygen, carbon and nitrogen, is formed, for example, by performing a cycle a predetermined number of times, the cycle including: supplying a silicon-containing gas to a heated wafer in a process chamber; supplying a carbon-containing gas; supplying a nitriding gas; and supplying an oxidizing gas.

Recently, since a high dielectric constant insulating film (high-k film) is used as a gate insulating film of transistors, it is increasingly required that the film forming temperature of a thin film formed near a gate, such as a sidewall film, is lowered to a low temperature range, for example, of 600 degrees C. or less, or 450 degrees C. or less. However, when the film forming temperature is lowered to such a low temperature range, a film forming rate of a thin film is reduced, causing a low productivity of semiconductor devices.

Also, if the film forming temperature of the SiOCN film is lowered, in some cases, an oxygen (O) concentration and a carbon (C) concentration are respectively reduced, and a nitrogen (N) concentration is increased as the film forming temperature is lowered. That is, in some cases, a composition of the SiOCN film approaches that of the SiN film, thereby increasing the dielectric constant of the SiOCN film.

SUMMARY

The present disclosure provides some embodiments of a method of manufacturing a semiconductor device, a substrate processing apparatus and a recording medium, which make it possible to suppress a reduction in film forming rate and an increase in dielectric constant when a thin film containing a predetermined element, oxygen, carbon and nitrogen is formed in a low temperature range.

According to some embodiments of the present disclosure, there is provided a method of manufacturing a semiconductor device, including forming a thin film containing a predetermined element, oxygen, carbon, and nitrogen on a substrate by performing a cycle a predetermined number of times after supplying a nitriding gas to the substrate, the cycle including performing the following steps in the following order:

supplying a carbon-containing gas to the substrate;
supplying a predetermined element-containing gas to the substrate;
supplying the carbon-containing gas to the substrate;
supplying an oxidizing gas to the substrate; and
supplying the nitriding gas to the substrate.

According to some other embodiments of the present disclosure, there is provided a substrate processing apparatus, including:

a process chamber configured to accommodate a substrate;
a predetermined element-containing gas supply system configured to supply a predetermined element-containing gas to the substrate in the process chamber;
a carbon-containing gas supply system configured to supply a carbon-containing gas to the substrate in the process chamber;
an oxidizing gas supply system configured to supply an oxidizing gas to the substrate in the process chamber;
a nitriding gas supply system configured to supply a nitriding gas to the substrate in the process chamber; and
a control unit configured to control the predetermined element-containing gas supply system, the carbon-containing gas supply system, the oxidizing gas supply system and the nitriding gas supply system such that a thin film containing the predetermined element, oxygen, carbon, and nitrogen is formed on the substrate in the process chamber by performing a cycle a predetermined number of times after supplying the nitriding gas to the substrate in the process chamber, the cycle including performing the following steps in the following order: supplying the carbon-containing gas to the substrate in the process chamber; supplying the predetermined element-containing gas to the substrate in the process chamber; supplying the carbon-containing gas to the substrate in the process chamber; supplying the oxidizing gas to the substrate in the process chamber; and supplying the nitriding gas to the substrate in the process chamber.

According to yet other embodiments of the present disclosure, there is provided a non-transitory computer-readable recording medium storing a program that causes a computer to perform a process of forming a thin film containing a predetermined element, oxygen, carbon, and nitrogen on a substrate in a process chamber by performing a cycle a predetermined number of times after supplying a nitriding gas to the substrate in the process chamber, the cycle including performing the following steps in the following order:

supplying a carbon-containing gas to the substrate in the process chamber;
supplying a predetermined element-containing gas to the substrate in the process chamber;
supplying the carbon-containing gas to the substrate in the process chamber;
supplying an oxidizing gas to the substrate in the process chamber; and supplying the nitriding gas to the substrate in the process chamber.

BRIEF DESCRIPTION OF THE DRAWINGS

FIGS. 4A and 4B are views illustrating gas supply timings in a first sequence and gas supply timings in a modification of the first sequence, respectively, according to an embodiment.

FIGS. 5A and 5B are views illustrating gas supply timings in a second sequence and gas supply timings in a modification of the second sequence, respectively, according to the embodiment.

FIGS. 6A and 6B are views illustrating gas supply timings in an example of the present disclosure and gas supply timings in a reference example, respectively.

DETAILED DESCRIPTION

Reference will now be made in detail to various embodiments, examples of which are illustrated in the accompanying drawings. In the following detailed description, numerous specific details are set forth in order to provide a thorough understanding of the present invention(s). However, it will be apparent to one of ordinary skill in the art that the present invention(s) may be practiced without these specific details. In other instances, well-known methods, procedures, systems, and components have not been described in detail so as not to unnecessarily obscure aspects of the various embodiments.

Embodiment of the Present Disclosure

Figure 1:
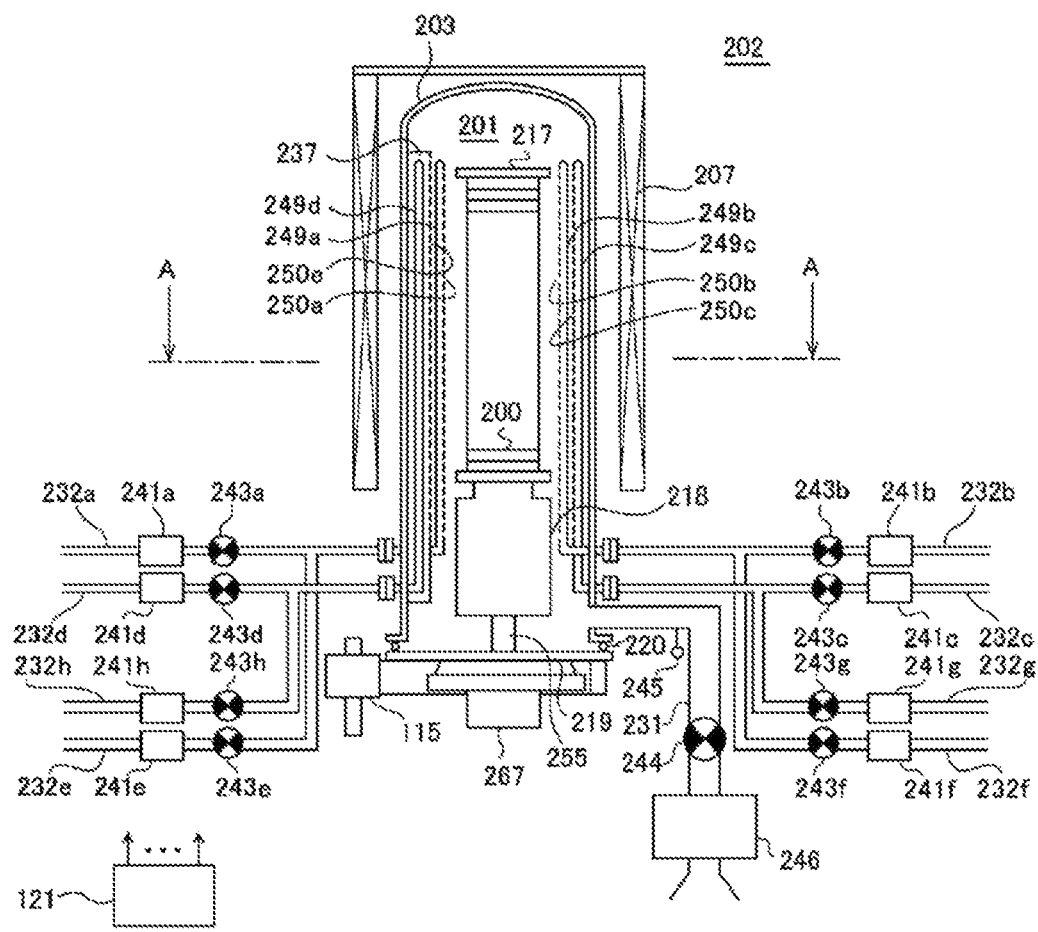
FIG. 1 is a schematic view illustrating a configuration of a vertical processing furnace of a substrate processing apparatus, in which a portion of the processing furnace is shown in a longitudinal sectional view, according to some embodiments.
Figure 2:
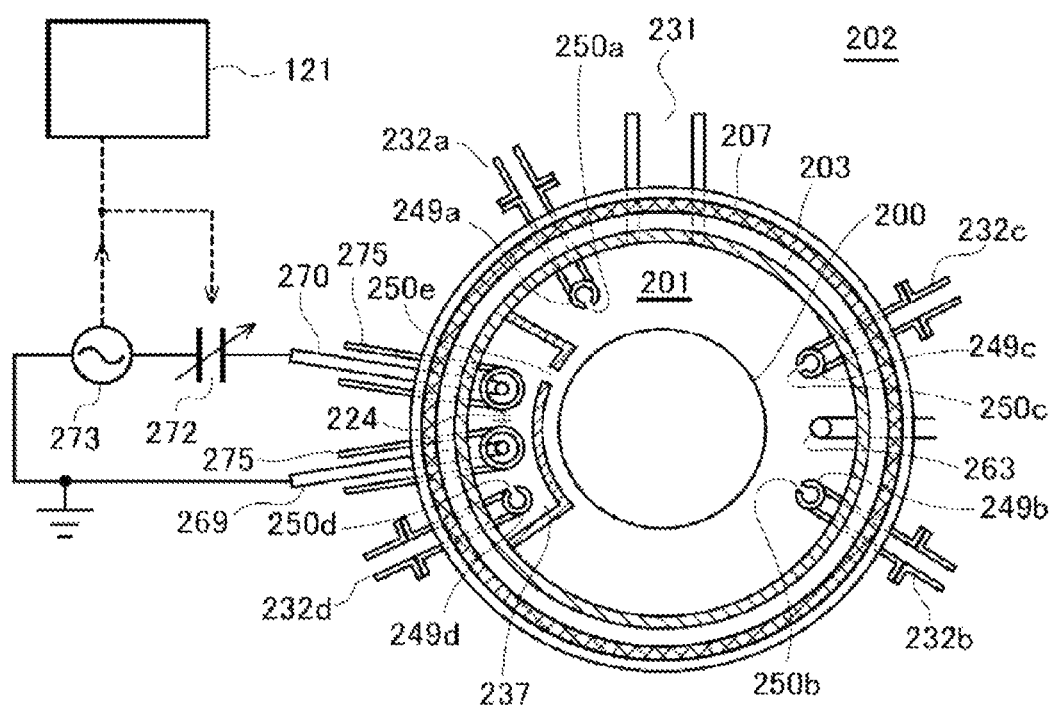
FIG. 2 is a schematic view illustrating a configuration of the vertical processing furnace of the substrate processing apparatus, in which a portion of the processing furnace is shown in a sectional view taken along line A-A in FIG. 1.

Hereinafter, embodiments of the present disclosure will now be described with reference to the drawings.
(1) Configuration of Substrate Processing Apparatus FIG. 1 is a schematic view illustrating a configuration of a vertical processing furnace 202 of a substrate processing apparatus, according to some embodiments, in which a portion of the processing furnace is shown in a longitudinal sectional view. FIG. 2 is a schematic view illustrating a configuration of the vertical processing furnace 202 of the substrate processing apparatus, according to some embodiments, in which a portion of the processing furnace is shown in a sectional view taken along line A-A in FIG. 1. The present disclosure is not limited to the substrate processing apparatus according to these embodiments, but may be applied to other substrate processing apparatuses having a processing furnace of a single wafer type, a hot wall type, a cold wall type, and the like.

As shown in FIG. 1, the vertical processing furnace 202 has a heater 207 as a heating unit (heating mechanism). The heater 207 has a cylindrical shape and is supported by a heater base (not shown) as a support plate so as to be vertically installed. The heater 207 acts as an activating mechanism to activate gas by heat, as described later.

A reaction tube 203 defining a reaction vessel (process vessel) is disposed inside the heater 207 in a concentric form along the heater 207. The reaction tube 203 is made of a heat resistant material such as quartz ($SiO_2$) or silicon carbide (SiC) and has a cylindrical shape with its upper end closed and its lower end opened. A process chamber 201 is provided in a hollow cylindrical portion of the reaction tube 203 and is configured to accommodate a plurality of wafers 200. The wafers 200 are horizontally stacked in multiple stages to be aligned in a vertical direction in a boat 217 described later.

A first nozzle 249a, a second nozzle 249b, a third nozzle 249c and a fourth nozzle 249d are provided in the process chamber 201 to penetrate through a lower portion of the reaction tube 203. The first nozzle 249a, the second nozzle 249b, the third nozzle 249c and the fourth nozzle 249d are respectively connected to a first gas supply pipe 232a, a second gas supply pipe 232b, a third gas supply pipe 232c and a fourth gas supply pipe 232d. In this way, the four nozzles 249a, 249b, 249c and 249d and the four gas supply pipes 232a, 232b, 232c and 232d are provided in the reaction tube 203 to allow several types of (four in this example) gases to be supplied into the process chamber 201.

Moreover, a manifold (not shown) formed of metal which supports the reaction tube 203 may be installed under the reaction tube 203 such that the nozzles penetrate through a sidewall of the metal manifold. In this case, an exhaust pipe 231 described later may be further installed at the metal manifold. Also, the exhaust pipe 231 may be installed at a lower portion of the reaction tube 203 rather than at the metal manifold. In this way, a furnace port of the processing furnace 202 may be formed of metal, and the nozzles may be mounted to the metal furnace port.

A mass flow controller (MFC) 241a, which is a flow rate controller (a flow rate control part), and a valve 243a, which is an opening/closing valve, are installed in the first gas supply pipe 232a in this order from an upstream direction. In addition, a first inert gas supply pipe 232e is connected to the first gas supply pipe 232a at a downstream side of the valve 243a. A mass flow controller 241e, which is a flow rate controller (a flow rate control part), and a valve 243e, which is an opening/closing valve, are installed at the first inert gas supply pipe 232e in this order from an upstream direction. In addition, the above-described first nozzle 249a is connected to a leading end portion of the first gas supply pipe 232a. The first nozzle 249a is installed in an arc-shaped space between an inner wall of the reaction tube 203 and the wafers 200. The first nozzle 249a is vertically disposed along the inner wall of the reaction tube 203 to rise upward in a stacking direction of the wafers 200. That is, the first nozzle 249a is installed at a side of a wafer arrangement region, in which the wafers 200 are arranged. The first nozzle 249a is configured as an L-shaped long nozzle and has its horizontal portion installed to penetrate through a lower sidewall of the reaction tube 203 and its vertical portion installed to rise from one end portion of the wafer arrangement region toward the other end portion thereof. A plurality of gas supply holes 250a through which gas is supplied is formed in a side surface of the first nozzle 249a. The gas supply holes 250a are opened toward a center of the reaction tube 203 to supply gas toward the wafers 200. The gas supply holes 250a are disposed at a predetermined opening pitch from a lower portion to an upper portion of the reaction tube 203. The gas supply holes 250a have the same opening area. A first gas supply system is mainly configured by the first gas supply pipe 232a, the mass flow controller 241a and the valve 243a. The first nozzle 249a may also be included in the first gas supply system. In addition, a first inert gas supply system is mainly configured by the first inert gas supply pipe 232e, the mass flow controller 241e and the valve 243e. The first inert gas supply system also functions as a purge gas supply system.

A mass flow controller (MFC) 241b, which is a flow rate controller (a flow rate control part), and a valve 243b, which is an opening/closing valve, are installed in the second gas supply pipe 232b in this order from the upstream direction. In addition, a second inert gas supply pipe 232f is connected to the second gas supply pipe 232b at a downstream side of the valve 243b. A mass flow controller 241f, which is a flow rate controller (a flow rate control part), and a valve 243f, which is an opening/closing valve, are installed at the second inert gas supply pipe 232f in this order from the upstream direction. In addition, the above-described second nozzle 249b is connected to a leading end portion of the second gas supply pipe 232b. The second nozzle 249b is installed in an arc-shaped space between the inner wall of the reaction tube 203 and the wafers 200. The second nozzle 249b is vertically disposed along the inner wall of the reaction tube 203 to rise upward in the stacking direction of the wafers 200. That is, the second nozzle 249b is installed at the side of the wafer arrangement region, in which the wafers 200 are arranged. The second nozzle 249b is configured as an L-shaped long nozzle and has its horizontal portion installed to penetrate through the lower sidewall of the reaction tube 203 and its vertical portion installed to rise from one end portion of the wafer arrangement region toward the other end portion thereof. A plurality of gas supply holes 250b through which the gas is supplied is formed in a side surface of the second nozzle 249b. The gas supply holes 250b are opened toward the center of the reaction tube 203 to supply gas toward the wafers 200. The gas supply holes 250b are disposed at predetermined opening pitch from the lower portion to the upper portion of the reaction tube 203. The gas supply holes 250b have the same opening area. A second gas supply system is mainly configured by the second gas supply pipe 232b, the mass flow controller 241b and the valve 243b. The second nozzle 249b may also be included in the second gas supply system. In addition, a second inert gas supply system is mainly configured by the second inert gas supply pipe 232f, the mass flow controller 241f and the valve 243f. The second inert gas supply system also functions as a purge gas supply system.

A mass flow controller (MFC) 241c, which is a flow rate controller (a flow rate control part), and a valve 243c, which is an opening/closing valve, are installed in the third gas supply pipe 232c in this order from the upstream direction. In addition, a third inert gas supply pipe 232g is connected to the third gas supply pipe 232c at a downstream side of the valve 243c. A mass flow controller 241g, which is a flow rate controller (a flow rate control part), and a valve 243g, which is an opening/closing valve, are installed at the third inert gas supply pipe 232g in this order from the upstream direction. In addition, the above-described third nozzle 249c is connected to a leading end portion of the third gas supply pipe 232c. The third nozzle 249c is installed in an arc-shaped space between the inner wall of the reaction tube 203 and the wafers 200. The third nozzle 249c is vertically disposed along the inner wall of the reaction tube 203 to rise upward in the stacking direction of the wafers 200. That is, the third nozzle 249c is installed at the side of the wafer arrangement region, in which the wafers 200 are arranged. The third nozzle 249c is configured as an L-shaped long nozzle and has its horizontal portion installed to penetrate through the lower sidewall of the reaction tube 203 and its vertical portion installed to rise from at least one end portion of the wafer arrangement region toward the other end portion thereof. A plurality of gas supply holes 250c through which gas is supplied is formed in a side surface of the third nozzle 249c. The gas supply holes 250c are opened toward the center of the reaction tube 203 to supply gas toward the wafers 200. The gas supply holes 250c are disposed at a predetermined opening pitch from the lower portion to the upper portion of the reaction tube 203. The gas supply holes 250c have the same opening area. A third gas supply system is mainly configured by the third gas supply pipe 232c, the mass flow controller 241c and the valve 243c. The third nozzle 249c may also be included in the third gas supply system. In addition, a third inert gas supply system is mainly configured by the third inert gas supply pipe 232g, the mass flow controller 241g and the valve 243g. The third inert gas supply system also functions as a purge gas supply system.

A mass flow controller (MFC) 241d, which is a flow rate controller (a flow rate control part), and a valve 243d, which is an opening/closing valve, are installed in the fourth gas supply pipe 232d in this order from the upstream direction. In addition, a fourth inert gas supply pipe 232h is connected to the fourth gas supply pipe 232d at a downstream side of the valve 243d. A mass flow controller 241h, which is a flow rate controller (a flow rate control part), and a valve 243h, which is an opening/closing valve, are installed at the fourth inert gas supply pipe 232h in this order from the upstream direction. In addition, the above-described fourth nozzle 249d is connected to a leading end portion of the fourth gas supply pipe 232d. The fourth nozzle 249d is installed inside a buffer chamber 237 that is a gas diffusion space.

The buffer chamber 237 is installed in an arc-shaped space between the inner wall of the reaction tube 203 and the wafers 200. The buffer chamber 237 is vertically disposed along the inner wall of the reaction tube 203 in the stacking direction of the wafers 200. That is, the buffer chamber 237 is installed at the side of the wafer arrangement region, in which the wafers 200 are arranged. A plurality of gas supply holes 250e through which gas is supplied is formed in an end portion of a wall of the buffer chamber 237 adjacent to the wafers 200. The gas supply holes 250e are opened toward the center of the reaction tube 203 to supply gas toward the wafers 200. The gas supply holes 250e are disposed at a predetermined opening pitch from the lower portion to the upper portion of the reaction tube 203. The gas supply holes 250e have the same opening area.

The fourth nozzle 249d is installed along the inner wall of the reaction tube 203 to rise upward in the stacking direction of the wafers 200 in an end portion of the buffer chamber 237 opposite to the end portion thereof in which the gas supply holes 250e is formed. That is, the fourth nozzle 249d is installed at the side of the wafer arrangement region, in which the wafers 200 are arranged. The fourth nozzle 249d is configured as an L-shaped long nozzle and has its horizontal portion installed to penetrate through the lower sidewall of the reaction tube 203 and its vertical portion installed to rise from one end portion of the wafer arrangement region toward the other end portion thereof. A plurality of gas supply holes 250d through which gas is supplied is formed in a side surface of the fourth nozzle 249d. The gas supply holes 250d are opened toward the center of the buffer chamber 237. The gas supply holes 250d are disposed at a predetermined opening pitch from the lower portion to the upper portion of the reaction tube 203 in the same way as the gas supply holes 250e of the buffer chamber 237. The plurality of gas supply holes 250d may have the same opening area and the same opening pitch from an upstream side (lower portion) to an downstream side (upper portion) when a pressure difference between the interior of the buffer chamber 237 and the interior of the process chamber 201 is small. However, when the pressure difference is large, the opening area of each gas supply hole 250d may be set larger and the opening pitch of each gas supply hole 250d may be set smaller at the downstream side than the upstream side.

In the embodiment, by adjusting the opening area or opening pitch of each gas supply hole 250d of the fourth nozzle 249d from the upstream side to the downstream side as described above, gases may be ejected at an almost same flow rate from the respective gas supply holes 250d despite a flow velocity difference. In addition, the gases ejected from the respective gas supply holes 250d are first introduced into the buffer chamber 237, and a flow velocity difference of the gases becomes uniform in the buffer chamber 237. That is, particle velocity of the gases ejected from the respective gas supply holes 250d of the fourth nozzle 249d into the buffer chamber 237 are reduced in the buffer chamber 237, and then are ejected from the respective gas supply holes 250e of the buffer chamber 237 into the process chamber 201. Therefore, the gases ejected from the respective gas supply holes 250d of the fourth nozzle 249d into the buffer chamber 237 have a uniform flow rate and flow velocity when the gases are ejected from the respective gas supply holes 250e of the buffer chamber 237 into the process chamber 201.

A fourth gas supply system is mainly configured by the fourth gas supply pipe 232d, the mass flow controller 241d, and the valve 243d. Also, the fourth nozzle 249d and the buffer chamber 237 may be included in the fourth gas supply system. In addition, a fourth inert gas supply system is mainly configured by the fourth inert gas supply pipe 232h, the mass flow controller 241h, and the valve 243h. The fourth inert gas supply system also functions as a purge gas supply system.

In the method of supplying gas according to the embodiment, the gas may be transferred through the nozzles 249a, 249b, 249c and 249d and the buffer chamber 237 disposed in an arc-shaped longitudinal space defined by the inner wall of the reaction tube 203 and end portions of the stacked wafers 200 The gas is first ejected into the reaction tube 203 near the wafers 200 through the gas supply holes 250a, 250b, 250c, 250d and 250e opened in the nozzles 249a, 249b, 249c, and 249d and buffer chamber 237, respectively. Thus, a main flow of the gas in the reaction tube 203 follows a direction parallel to surfaces of the wafers 200, i.e., the horizontal direction. With this configuration, the gas can be uniformly supplied to the respective wafers 200, and thus, a film thickness of a thin film formed on each of the wafers 200 can be uniform. In addition, a residual gas after the reaction flows toward an exhaust port, i.e., the exhaust pipe 231, but a flow direction of the residual gas is not limited to the vertical direction but may be appropriately adjusted by a position of the exhaust port.

As a predetermined element-containing gas, a silicon precursor gas such as a silane-based gas, i.e., a gas containing silicon (Si) that is the predetermined element (silicon-containing gas), for example, is supplied from the first gas supply pipe 232a into the process chamber 201 through the mass flow controller 241a, the valve 243a and the first nozzle 249a. The silicon-containing gas may include, for example, hexachlorodisilane ($Si_2Cl_6$, abbreviated to HCDS) gas. When a liquid precursor in a liquid state under normal temperature and pressure, such as HCDS, is used, the liquid precursor is vaporized by a vaporization system, such as a vaporizer or a bubbler, and supplied as a precursor gas (HCDS gas).

A carbon-containing gas, i.e., a gas containing carbon (C) is supplied from the second gas supply pipe 232b into the process chamber 201 through the mass flow controller 241b, the valve 243b, and the second nozzle 249b. The carbon-containing gas may include, for example, a hydrocarbon-based gas such as propylene ($C_3H_6$) gas.

An oxidizing gas, i.e., a gas containing oxygen (O) (oxygen-containing gas) is supplied from the third gas supply pipe 232c into the process chamber 201 through the mass flow controller 241c, the valve 243c, and the third nozzle 249c. The oxidizing gas may include, for example, oxygen ($O_2$) gas.

A nitriding gas, i.e., a gas containing nitrogen (N) (nitrogen-containing gas) is supplied from the fourth gas supply pipe 232d into the process chamber 201 through the mass flow controller 241d, the valve 243d, the fourth nozzle 249d, the buffer chamber 237. The nitriding gas may include, for example, ammonia ($NH_3$) gas.

A nitrogen ($N_2$) gas, for example, is supplied from the inert gas supply pipes 232e, 232f, 232g and 232h into the process chamber 201 through the mass flow controllers 241e, 241f, 241g and 241h, the valves 243e, 243f, 243g and 243h, the gas supply pipes 232a, 232b, 232c and 232d, the nozzles 249a, 249b, 249c and 249d, and the buffer chamber 237, respectively.

Moreover, for example, when the above-described gases are allowed to flow through the respective gas supply pipes, a predetermined element-containing gas supply system, i.e., a silicon-containing gas supply system (silane-based gas supply system) is configured by the first gas supply system. In addition, a carbon-containing gas supply system, i.e., a hydrocarbon-based gas supply system is configured by the second gas supply system. Further, an oxidizing gas supply system, i.e., an oxygen-containing gas supply system is configured by the third gas supply system. Furthermore, a nitriding gas supply system, i.e., a nitrogen-containing gas supply system is configured by the fourth gas supply system. The predetermined element-containing gas supply system may also be referred to as "a precursor gas supply system," or simply "a precursor supply system." Also, when the carbon-containing gas, the oxidizing gas and the nitriding gas may be generally simply referred to as "a reaction gas," a reaction gas supply system is configured by the carbon-containing gas supply system, the oxidizing gas supply system and the nitriding gas supply system.

In the buffer chamber 237, as illustrated in FIG. 2, a first rod-shaped electrode 269 that is a first electrode having an elongated structure and a second rod-shaped electrode 270 that is a second electrode having an elongated structure are disposed to span from the lower portion to the upper portion of the reaction tube 203 in the stacking direction of the wafers 200. Each of the first rod-shaped electrode 269 and the second rod-shaped electrode 270 is disposed in parallel to the fourth nozzle 249d. Each of the first rod-shaped electrode 269 and the second rod-shaped electrode 270 is covered with and protected by an electrode protection tube 275, which is a protection tube for protecting each electrode from an upper portion to a lower portion thereof. Any one of the first rod-shaped electrode 269 and the second rod-shaped electrode 270 is connected to a high-frequency power source 273 through a matcher 272, and the other one is connected to a ground corresponding to a reference electric potential. By applying high-frequency power from the high-frequency power source 273 between the first rod-shaped electrode 269 and the second rod-shaped electrode 270 through the matcher 272, plasma is generated in a plasma generation region 224 between the first rod-shaped electrode 269 and the second rod-shaped electrode 270. A plasma source as a plasma generator (plasma generating part) is mainly configured by the first rod-shaped electrode 269, the second rod-shaped electrode 270 and the electrode protection tubes 275. The matcher 272 and the high-frequency power source 273 may also be included in the plasma source. Also, as described later, the plasma source functions as an activating mechanism (exciting part) that activates (excites) gas to plasma.

The electrode protection tube 275 has a structure in which each of the first rod-shaped electrode 269 and the second rod-shaped electrode 270 can be inserted into the buffer chamber 237 in a state where each of the first rod-shaped electrode 269 and the second rod-shaped electrode 270 is isolated from an internal atmosphere of the buffer chamber 237. Here, when an internal oxygen concentration of the electrode protection tube 275 is equal to an oxygen concentration in an ambient air (atmosphere), each of the first rod-shaped electrode 269 and the second rod-shaped electrode 270 inserted into the electrode protection tubes 275 is oxidized by the heat generated by the heater 207. Therefore, by charging the inside of the electrode protection tube 275 with an inert gas such as nitrogen gas, or by purging the inside of the electrode protection tube 275 with an inert gas such as nitrogen gas using an inert gas purging mechanism, the internal oxygen concentration of the electrode protection tube 275 decreases, thereby preventing oxidation of the first rod-shaped electrode 269 or the second rod-shaped electrode 270.

The exhaust pipe 231 for exhausting an internal atmosphere of the process chamber 201 is installed at the reaction tube 203. A vacuum exhaust device, for example, a vacuum pump 246, is connected to the exhaust pipe 231 through a pressure sensor 245, which is a pressure detector (pressure detecting part) for detecting an internal pressure of the process chamber 201, and an auto pressure controller (APC) valve 244, which is a pressure adjuster (pressure adjusting part). The APC valve 244 is configured to perform/stop vacuum exhaust in the process chamber 201 by opening/closing the valve with the actuated vacuum pump 246, and further to adjust the internal pressure of the process chamber 201 by adjusting a degree of the valve opening with the actuated vacuum pump 246. An exhaust system is mainly configured by the exhaust pipe 231, the APC valve 244, and the pressure sensor 245. Also, the vacuum pump 246 may be included in the exhaust system. The exhaust system is configured to adjust the degree of the valve opening of the APC valve 244 based on pressure information detected by the pressure sensor 245 while operating the vacuum pump 246 such that the internal pressure of the process chamber 201 is vacuum exhausted to a predetermined pressure (a vacuum level).

A seal cap 219, which functions as a furnace port cover configured to hermetically seal a lower end opening of the reaction tube 203, is installed under the reaction tube 203. The seal cap 219 is configured to contact the lower end of the reaction tube 203 from the below in the vertical direction. The seal cap 219, for example, may be formed of metal such as stainless and have a disc shape. An O-ring 220, which is a seal member in contact with the lower end portion of the reaction tube 203, is installed at an upper surface of the seal cap 219. A rotary mechanism 267 configured to rotate the boat 217, which is a substrate holder to be described later, is installed below the seal cap 219. A rotary shaft 255 of the rotary mechanism 267 passes through the seal cap 219 to be connected to the boat 217. The rotary mechanism 267 is configured to rotate the wafers 200 by rotating the boat 217. The seal cap 219 is configured to be vertically elevated or lowered by a boat elevator 115, which is an elevation mechanism vertically disposed in the outside of the reaction tube 203. The boat elevator 115 is configured to enable the boat 217 to be loaded into or unloaded from the process chamber 201 by elevating or lowering the seal cap 219. That is, the boat elevator 115 is configured as a transfer device (transfer mechanism) that transfers the boat 217, i.e., the wafers 200, into and out of the process chamber 201.

The boat 217, which is used as a substrate support, is made of a heat resistant material such as quartz or silicon carbide and is configured to support a plurality of the wafers 200 horizontally stacked in multiple stages with the centers of the wafers 200 concentrically aligned. In addition, a heat insulating member 218 formed of a heat resistant material such as quartz or silicon carbide is installed at a lower portion of the boat 217 and configured such that heat from the heater 207 cannot be transferred to the seal cap 219. In addition, the heat insulating member 218 may be configured by a plurality of heat insulating plates formed of a heat resistant material such as quartz or silicon carbide, and a heat insulating plate holder configured to support the heat insulating plates in a horizontal posture in a multi-stage manner.

A temperature sensor 263, which is a temperature detector, is installed in the reaction tube 203. Based on temperature information detected by the temperature sensor 263, an electric conduction state to the heater 207 is adjusted such that the interior of the process chamber 201 has a desired temperature distribution. The temperature sensor 263 is configured in an L-shape similar to the nozzles 249a, 249b, 249c and 249d and installed along the inner wall of the reaction tube 203.

Figure 3:
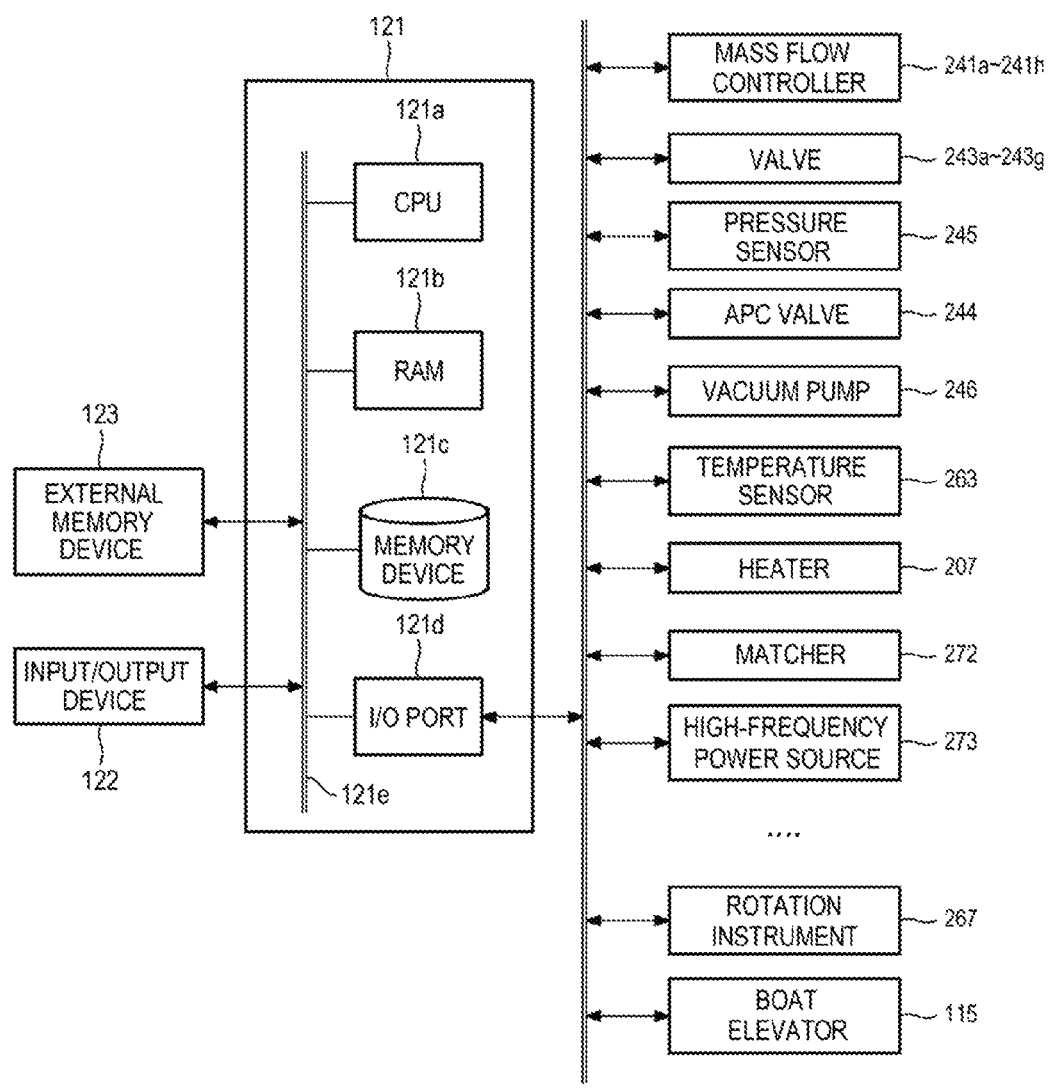
FIG. 3 is a schematic view illustrating a configuration of a controller of the substrate processing apparatus according to some embodiments.

As illustrated in FIG. 3, a controller 121, which is a control unit (control part), is configured as a computer including a central processing unit (CPU) 121a, a random access memory (RAM) 121b, a memory device 121c, and an I/O port 121d. The RAM 121b, the memory device 121c and the I/O port 121d are configured to exchange data with the CPU 121a via an internal bus 121e. An input/output device 122, for example, including a touch panel or the like, is connected to the controller 121.

The memory device 121c is configured by, for example, a flash memory, a hard disc drive (HDD), or the like. A control program for controlling operation of the substrate processing apparatus or a process recipe, in which a sequence or condition for processing a substrate described later is written, is readably stored in the memory device 121c. Also, the process recipe functions as a program for the controller 121 to execute each sequence in the substrate processing process, which will be described later, to obtain a predetermined result. Hereinafter, the process recipe or control program may be generally referred to as "a program." Also, when the term "program" is used herein, it may include the case in which only the process recipe is included, the case in which only the control program is included, or the case in which both of the process recipe and the control program are included. In addition, the RAM 121b is configured as a memory area (work area) in which a program or data read by the CPU 121a is temporarily stored.

The I/O port 121d is connected to the mass flow controllers 241a, 241b, 241c, 241d, 241e, 241f, 241g and 241h, the valves 243a, 243b, 243c, 243d, 243e, 243f, 243g and 243h, the pressure sensor 245, the APC valve 244, the vacuum pump 246, the heater 207, the temperature sensor 263, the high-frequency power source 273, the matcher 272, the rotary mechanism 267, the boat elevator 115 and the like.

The CPU 121a is configured to read and execute the control program from the memory device 121c. According to an input of an operation command from the input/output device 122, the CPU 121a reads the process recipe from the memory device 121c. In addition, the CPU 121a is configured to control the flow rate controlling operation of various types of gases by the mass flow controllers 241a, 241b, 241c, 241d, 241e, 241f, 241g and 241h, the opening/closing operation of the valves 243a, 243b, 243c, 243d, 243e, 243f, 243g and 243h, the opening/closing operation of the APC valve 244 and the pressure adjusting operation by the APC valve 244 based on the pressure sensor 245, the operation of starting and stopping the vacuum pump 246, the temperature adjusting operation of the heater 207 based on the temperature sensor 263, the rotation and rotation speed adjusting operation of the boat 217 by the rotary mechanism 267, the elevation operation of the boat 217 by the boat elevator 115, the operation of supplying power by the high-frequency power source 273, the impedance adjusting operation of the matcher 272, and the like according to contents of the read process recipe.

Moreover, the controller 121 is not limited to being configured as a dedicated computer but may be configured as a general-purpose computer. For example, the controller 121 according to the embodiment may be configured by preparing an external memory device 123 (for example, a magnetic tape, a magnetic disc such as a flexible disc or a hard disc, an optical disc such as a CD or DVD, a magneto-optical disc such as an MO, a semiconductor memory such as a USB memory or a memory card), in which the program is stored, and installing the program on the general-purpose computer using the external memory device 123. Also, a means for supplying a program to a computer is not limited to the case in which the program is supplied through the external memory device 123. For example, the program may be supplied using a communication means such as the Internet or a dedicated line, rather than through the external memory device 123. Also, the memory device 121c or the external memory device 123 is configured as a non-transitory computer-readable recording medium. Hereinafter, these means for supplying the program will be simply referred to as "a recording medium." In addition, when the term "recording medium" is used herein, it may include a case in which only the memory device 121c is included, a case in which only the external memory device 123 is included, or a case in which both the memory device 121c and the external memory device 123 are included.

(2) Substrate Processing Process

Next, an example of a sequence of forming a thin film on a substrate, which is one of the processes of manufacturing a semiconductor device by using the processing furnace 202 of the above-described substrate processing apparatus, will be described. In addition, in the following description, operations of the respective parts constituting the substrate processing apparatus are controlled by the controller 121.

Moreover, in the embodiment, in order to form a composition ratio of a thin film to be formed as a stoichiometric composition or another predetermined composition ratio different from the stoichiometric composition, supply conditions of a plurality of types of gases containing a plurality of elements constituting the film to be formed are controlled. For example, the supply conditions are controlled such that at least one element of a plurality of elements constituting the thin film to be formed stoichiometrically exceeds another element. Hereinafter, an example of a sequence of forming a film while controlling a ratio of the plurality of elements constituting the thin film to be formed, i.e., a composition ratio of the film, will be described.

(First Sequence)

First of all, a first sequence of the embodiment will be described.

FIG. 4A is a view illustrating gas supply timings in the first sequence of the embodiment.

In the first sequence of the embodiment, a thin film containing a predetermined element, oxygen, carbon, and nitrogen is formed on a wafer 200 by performing a cycle a predetermined number of times after supplying a nitriding gas to the wafer 200. The cycle includes performing the following steps in the following order:

supplying a carbon-containing gas to the wafer 200;

supplying a predetermined element-containing gas to the wafer 200;

supplying the carbon-containing gas to the wafer 200;

supplying an oxidizing gas to the wafer 200; and supplying the nitriding gas to the wafer 200.

Further, in the process of forming the thin film, an uppermost surface of the wafer 200 is modified by supplying the nitriding gas to the wafer 200 before the cycle is performed a predetermined number of times.

Furthermore, in the act of forming the thin film, a first carbon-containing layer is formed in a portion of the uppermost surface of the wafer 200 modified by the nitriding gas by supplying the carbon-containing gas to the wafer 200, a predetermined element-containing layer is formed on the uppermost surface of the wafer 200 modified by the nitriding gas and having the first carbon-containing layer formed in the portion thereof by supplying the predetermined element-containing gas to the wafer 200, a second carbon-containing layer is formed on the predetermined element-containing layer by supplying the carbon-containing gas to the wafer 200, a layer containing the predetermined element, oxygen and carbon is formed by supplying the oxidizing gas to the wafer 200 to oxidize a layer including the first carbon-containing layer, the predetermined element-containing layer and the second carbon-containing layer, and a layer containing the predetermined element, oxygen, carbon and nitrogen is formed and an uppermost surface thereof is modified by supplying the nitriding gas to the wafer 200 to nitride the layer containing the predetermined element, oxygen and carbon.

Also, the first carbon-containing layer is formed by adsorbing the carbon-containing gas onto the portion of the uppermost surface of the wafer 200 modified by the nitriding gas. Specifically, at least a portion of the first carbon-containing layer is formed by substituting the carbon-containing gas for a portion of the nitriding gas adsorbed onto at least a portion of the uppermost surface of the wafer 200 modified by the nitriding gas.

Hereinafter, the first sequence of the embodiment will be described. According to the embodiment, HCDS gas that is a silicon-containing gas is used as the predetermined element-containing gas, $C_3H_6$ gas is used as the carbon-containing gas, $O_2$ gas is used as the oxidizing gas, and $NH_3$ gas is used as the nitriding gas, and a silicon oxycarbonitride film (SiOCN film) containing silicon, oxygen, carbon and nitrogen is formed on the wafer 200 by the film forming sequence of FIG. 4A, i.e., the film forming sequence of performing a cycle a predetermined number of times after supplying the NH$_3$ gas, the cycle including performing the following steps in the following order: supplying the C$_3$H$_6$ gas, supplying the HCDS gas, supplying the C$_3$H$_6$ gas, supplying the O$_2$ gas, and supplying the NH$_3$ gas.

Moreover, when the term "wafer" is used herein, it may refer to "the wafer itself" or "the wafer and a laminated body (a collected body) of predetermined layers or films formed on the surface of the wafer" (i.e., the wafer including the predetermined layers or films formed on the surface may be referred to as a wafer). In addition, the phrase "a surface of a wafer" as used herein may refer to "a surface (an exposed surface) of a wafer itself" or "a surface of a predetermined layer or film formed on the wafer, i.e., the uppermost surface of the wafer, which is a laminated body."

Accordingly, "a predetermined gas is supplied to a wafer" may mean that "a predetermined gas is directly supplied to a surface (an exposed surface) of a wafer itself" or that "a predetermined gas is supplied to a layer or a film formed on a wafer, i.e., on the uppermost surface of a wafer as a laminated body." Also, "a predetermined layer (or film) is formed on a wafer" may mean that "a predetermined layer (or film) is directly formed on a surface (an exposed surface) of a wafer itself" or that "a predetermined layer (or film) is formed on a layer or a film formed on a wafer, i.e., on the uppermost surface of a wafer as a laminated body."

Moreover, the term "substrate" as used herein may be synonymous with the term "wafer," and in this case, the terms "wafer" and "substrate" may be used interchangeably in the above description.

(Wafer Charging and Boat Loading)

When the plurality of wafers 200 are charged on the boat 217 (wafer charging), as illustrated in FIG. 1, the boat 217 supporting the plurality of wafers 200 is raised by the boat elevator 115 to be loaded into the process chamber 201 (boat loading). In this state, the seal cap 219 seals the lower end of the reaction tube 203 via the O-ring 220.

(Pressure Adjustment and Temperature Adjustment)

The interior of the process chamber 201 is vacuum exhausted by the vacuum pump 246 to a desired pressure (vacuum level). Here, the internal pressure of the process chamber 201 is measured by the pressure sensor 245, and the APC valve 244 is feedback-controlled based on the measured pressure information (pressure adjustment). Also, the vacuum pump 246 maintains a regular operation state at least until the processing of the wafers 200 is terminated. Further, the process chamber 201 is heated by the heater 207 to a desired temperature. Here, an electrical conduction state to the heater 207 is feedback-controlled based on the temperature information detected by the temperature sensor 263 until the interior of the process chamber 201 reaches a desired temperature distribution (temperature adjustment). In addition, heating of the interior of the process chamber 201 by the heater 207 is continuously performed at least until processing of the wafers 200 is terminated. Next, the boat 217 and wafers 200 begin to be rotated by the rotary mechanism 267 (wafer rotation). Furthermore, the rotation of the boat 217 and wafers 200 by the rotary mechanism 267 is continuously performed at least until processing of the wafers 200 is terminated.

[Process of Forming Silicon Oxycarbonitride Film]

Next, a surface modifying step described later is performed, and then five steps described later, i.e., Steps 1 to 5, are sequentially performed.

[Surface Modifying Step]

(NH$_3$ Gas Supply)

The valve 243$d$ of the fourth gas supply pipe 232$d$ is opened to flow NH$_3$ gas into the fourth gas supply pipe 232$d$. A flow rate of the NH$_3$ gas flowing into the fourth gas supply pipe 232$d$ is adjusted by the mass flow controller 241$d$. The flow rate-adjusted NH$_3$ gas is supplied into the buffer chamber 237 through the gas supply holes 250$d$ of the fourth nozzle 249$d$. At this time, if no high-frequency power is applied between the first rod-shaped electrode 269 and the second rod-shaped electrode 270, the NH$_3$ gas supplied into the buffer chamber 237 is activated by heat to be supplied into the process chamber 201 through the gas supply holes 250$e$ and exhausted through the exhaust pipe 231. In this way, the NH$_3$ gas activated by heat is supplied to the wafer 200. On the other hand, at this time, if high-frequency power is applied between the first rod-shaped electrode 269 and the second rod-shaped electrode 270, the NH$_3$ gas supplied into the buffer chamber 237 may be excited to plasma to be supplied into the process chamber 201. In this case, the high-frequency power applied between the first rod-shaped electrode 269 and the second rod-shaped electrode 270 from the high-frequency power source 273 is set to fall within a range of, for example, 50 to 1000 W. The other processing conditions are set to be equal to processing conditions (described later) when the NH$_3$ gas is activated by heat.

At the same time, the valve 243$h$ is opened to flow the N$_2$ gas into the fourth inert gas supply pipe 232$h$. The N$_2$ gas flowing in the fourth inert gas supply pipe 232$h$ is supplied into the process chamber 201 through the buffer chamber 237 together with the NH$_3$ gas, and exhausted through the exhaust pipe 231. In order to prevent infiltration of the NH$_3$ gas into the first nozzle 249$a$, the second nozzle 249$b$, and the third nozzle 249$c$, the valves 243$e$, 243$f$ and 243$g$ are opened to flow the N$_2$ gas into the first inert gas supply pipe 232$e$, the second inert gas supply pipe 232$f$, and the third inert gas supply pipe 232$g$. The N$_2$ gas is supplied into the process chamber 201 through the first gas supply pipe 232$a$, the second gas supply pipe 232$b$, the third gas supply pipe 232$c$, the first nozzle 249$a$, the second nozzle 249$b$, and the third nozzle 249$c$, and exhausted through the exhaust pipe 231.

When the NH$_3$ gas is activated by heat to be allowed to flow, the APC valve 244 is appropriately adjusted to set the internal pressure of the process chamber 201 to fall within a range of, for example, 1 to 6000 Pa. A supply flow rate of the NH$_3$ gas controlled by the mass flow controller 241$d$ is set to fall within a range of, for example, 100 to 10000 sccm. A supply flow rate of the N$_2$ gas controlled by each of the mass flow controllers 241$h$, 241$e$, 241$f$ and 241$g$ is set to fall within a range of, for example, 100 to 10000 sccm. Here, a partial pressure of the NH$_3$ gas in the process chamber 201 is set to fall within a range of, for example, 0.01 to 5941 Pa. A duration for supplying the NH$_3$ gas to the wafer 200, i.e., a gas supply time (irradiation time), is set to fall within a range of, for example, 1 to 600 seconds. Also, a gas supply time of the NH$_3$ gas in the surface modification step may be set to be longer than a gas supply time of the NH$_3$ gas in Step 5 described later. Accordingly, a surface modification processing (described later) may be sufficiently performed on the uppermost surface of the wafer 200 before a film is formed. Here, a temperature of the heater 207 is set such that a temperature of the wafer 200 falls within a range of, for example, 250 to 700 degrees C., or more specifically, for example, 300 to 650 degrees C. Since the NH$_3$ gas has a high reaction temperature and is difficult to react at the above-described wafer temperature, it is possible to thermally activate the NH$_3$ gas by setting the internal pressure of the process chamber 201 to the relatively high pressure as described above. In addition, since the NH$_3$ gas is activated by heat and supplied to generate a soft reaction, the surface modification described later can be gently performed.

The uppermost surface (base surface when the SiOCN film is formed) of the wafer 200 is modified by supplying the activated NH$_3$ gas to the uppermost surface of the wafer 200 (surface modification processing). Specifically, the NH3 gas is adsorbed onto the uppermost surface of the wafer 200, an adsorption layer of the NH$_3$ gas is formed on the uppermost surface of the wafer 200. At that time, the uppermost surface of the wafer 200 may react with the activated NH$_3$ gas to be nitrided, and thus, a layer having Si—N bonding, i.e., a nitride layer (silicon nitride layer) containing silicon (Si) and nitrogen (N) may be further formed on the uppermost surface of the wafer 200. That is, both the nitride layer and the adsorption layer of the NH$_3$ gas may be formed on the uppermost surface of the wafer 200.

The adsorption layer of the NH$_3$ gas includes a chemisorption layer in which gas molecules of the NH$_3$ gas are discontinuous, in addition to a chemisorption layer in which the gas molecules are continuous. That is, the adsorption layer of the NH$_3$ gas includes a chemisorption layer constituted by NH$_3$ gas molecules having a thickness of one molecular layer or less than one molecular layer. Also, the NH$_3$ gas molecules constituting the adsorption layer of the NH$_3$ gas contain molecules in which bonding of N and H is partially broken (N$_x$H$_y$ molecules). That is, the adsorption layer of the NH$_3$ gas includes a chemisorption layer in which the NH$_3$ gas molecules and/or the N$_x$H$_y$ molecules are continuous or a chemisorption layer in which the NH$_3$ gas molecules and/or the N$_x$H$_y$ molecules are discontinuous. Also, the nitride layer includes a discontinuous layer as well as a continuous layer containing Si and Cl. That is, the nitride layer includes a layer including Si—N bonding having a thickness of less than one atomic layer to several atomic layers. Also, a layer having a thickness of less than one molecular layer refers to a discontinuously formed molecular layer, and a layer having a thickness of one molecular layer refers to a continuously formed molecular layer. In addition, a layer having a thickness of less than one atomic layer refers to a discontinuously formed atomic layer, and a layer having a thickness of one atomic layer refers to a continuously formed atomic layer.

The uppermost surface of the wafer 200 after the surface modification processing is performed becomes a surface state in which HCDS gas supplied in Step 2 described later is easily adsorbed and Si is easily deposited. That is, the NH$_3$ gas used in the surface modification step acts as an adsorption and deposition facilitating gas that facilitates adsorption or deposition of the HCDS gas or Si onto the uppermost surface of the wafer 200.

(Residual Gas Removal)

Thereafter, the valve 243d of the fourth gas supply pipe 232d is closed to stop the supply of the NH$_3$ gas. At this time, while the APC valve 244 of the exhaust pipe 231 is in an open state, the interior of the process chamber 201 is vacuum exhausted by the vacuum pump 246, and the NH$_3$ gas remaining in the process chamber 201 which does not react or remains after contributing to the surface modification of the wafer 200 or reaction byproducts are removed from the process chamber 201. At this time, the valves 243h, 243e, 243f and 243g are in an open state, and the supply of the N$_2$ gas into the process chamber 201 is maintained. Accordingly, the NH$_3$ gas remaining in the process chamber 201 which does not react or remains after contributing to the surface modification or reaction byproducts can be more effectively removed from the process chamber 201.

Moreover, in this case, the gas remaining in the process chamber 201 may not be completely removed, and the interior of the process chamber 201 may not be completely purged. When the gas remaining in the process chamber 201 is very small in amount, there is no adverse effect generated in Step 1 performed thereafter. Here, an amount of the N$_2$ gas supplied into the process chamber 201 need not be a large amount, and for example, approximately the same amount of the N$_2$ gas as the reaction tube 203 (the process chamber 201) may be supplied to perform the purge such that there is no adverse effect generated in Step 1. As described above, as the interior of the process chamber 201 is not completely purged, the purge time can be reduced, thereby improving the throughput. In addition, the consumption of the N$_2$ gas can also be suppressed to a minimal necessity.

The nitriding gas may include diazene (N$_2$H$_2$) gas, hydrazine (N$_2$H$_4$) gas, N$_3$H$_8$ gas, and the like, in addition to ammonia (NH$_3$) gas. The inert gas may include a rare gas such as Ar gas, He gas, Ne gas, Xe gas, and the like, in addition to the N2 gas.

[Step 1]

(C$_3$H$_6$ Gas Supply)

After the surface modification step is terminated and the residual gas in the process chamber 201 is removed, the valve 243b of the second gas supply pipe 232b is opened to flow the C$_3$H$_6$ gas into the second gas supply pipe 232b. A flow rate of the C$_3$H$_6$ gas flowing into the second gas supply pipe 232b is adjusted by the mass flow controller 241b. The flow rate-adjusted C$_3$H$_6$ gas is supplied into the process chamber 201 through the gas supply holes 250b of the second nozzle 249b. The C$_3$H$_6$ gas supplied into the process chamber 201 is activated by heat and exhausted through the exhaust pipe 231. Here, the C$_3$H$_6$ gas activated by heat is supplied to the wafer 200.

At the same time, the valve 243f is opened to flow the N$_2$ gas into the second inert gas supply pipe 232f. The N$_2$ gas flowing in the second inert gas supply pipe 232f is supplied into the process chamber 201 together with the C$_3$H$_6$ gas, and exhausted through the exhaust pipe 231. In this case, in order to prevent infiltration of the C$_3$H$_6$ gas into the first nozzle 249a, the third nozzle 249c, the fourth nozzle 249d, and the buffer chamber 237, the valves 243e, 243g and 243h are opened to flow the N$_2$ gas into the first inert gas supply pipe 232e, the third inert gas supply pipe 232g, and the fourth inert gas supply pipe 232h. The N$_2$ gas is supplied into the process chamber 201 through the first gas supply pipe 232a, the third gas supply pipe 232c, the fourth gas supply pipe 232d, the first nozzle 249a, the third nozzle 249c, the fourth nozzle 249d, and the buffer chamber 237, and exhausted through the exhaust pipe 231.

Further, the APC valve 244 is appropriately adjusted to set the internal pressure of the process chamber 201 to fall within a range of, for example, 1 to 6000 Pa. A supply flow rate of the C$_3$H$_6$ gas controlled by the mass flow controller 241b is set to fall within a range of, for example, 100 to 10000 sccm. A supply flow rate of the N$_2$ gas controlled by each of the mass flow controllers 241f, 241e, 241g and 241h is set to fall within a range of, for example, 100 to 10000 sccm. Here, a partial pressure of the C$_3$H$_6$ gas in the process chamber 201 is set to fall within a range of, for example, 0.01 to 5941 Pa. A duration for supplying the C$_3$H$_6$ gas to the wafer 200, i.e., a gas supply time (irradiation time), is set to fall within a range of, for example, 1 to 200 seconds, specifically, for example, 1 to 120 seconds, or more specifically, for example, 1 to 60 seconds. In this case, in the same way as the surface modification step, a temperature of the heater 207 is set such that a temperature of the wafer 200 is a temperature within a range of, for example, 250 to 700 degrees C., or more specifically, for example, 300 to 650 degrees C. In addition, since the $C_3H_6$ gas is activated by heat and supplied to generate a soft reaction, a first carbon-containing layer described later is easily formed.

The first carbon-containing layer is formed in a portion of the uppermost surface of the wafer 200 modified by the $NH_3$ gas in the surface modification step, by supplying the wafer 200 with the $C_3H_6$ gas activated by heat. At least a portion of the first carbon-containing layer is formed in such a manner that a portion of the $NH_3$ gas adsorbed onto at least a portion of the uppermost surface of the wafer 200 modified by the $NH_3$ gas in the surface modification step is substituted by the $C_3H_6$ gas. That is, at least the portion of the first carbon-containing layer is formed in such a manner that a portion of the $NH_3$ gas constituting the adsorption layer of the $NH_3$ gas formed on the uppermost surface of the wafer 200 in the surface modification step is desorbed from the uppermost surface of the wafer 200 by the energy of the activated $C_3H_6$ gas and then the $C_3H_6$ gas is chemisorbed onto the portion in which the $NH_3$ gas is desorbed from the uppermost surface of the wafer 200. Here, in addition to the chemisorption layer of the $C_3H_6$ gas, a chemisorption layer of a substance ($C_xH_y$) produced by decomposing the $C_3H_6$ or a carbon layer (C layer) may be formed, which may be considered as being included in a portion of the first carbon-containing layer.

At this time, the $C_3H_6$ gas may be adsorbed onto a portion of the uppermost surface of the wafer 200 without substituting the $NH_3$ gas with the $C_3H_6$ gas, i.e., without desorbing the $NH_3$ gas from the uppermost surface of the wafer 200. For example, a portion of the $C_3H_6$ gas supplied to the wafer 200 may be adsorbed onto the adsorption layer of the $NH_3$ gas formed on the uppermost surface of the wafer 200 in the surface modification step. In addition, a portion of the $C_3H_6$ gas supplied to the wafer 200 may be adsorbed onto the nitride layer formed on the uppermost surface of the wafer 200 in the surface modification step. Further, a portion of the $C_3H_6$ gas supplied to the wafer 200 may be adsorbed onto a portion of the uppermost surface of the wafer 200 in which the nitride layer or the adsorption layer of the $NH_3$ gas is not formed. In this way, in some cases, the $C_3H_6$ gas is adsorbed onto a portion of the uppermost surface of the wafer 200 without substituting the $NH_3$ gas with the $C_3H_6$ gas, which may be considered as being included in a portion of the first carbon-containing layer. Also, even in such a case, without limitation to the chemisorption layer of the $C_3H_6$ gas, a chemisorption layer of a substance ($C_xH_y$) produced by decomposing $C_3H_6$ or a carbon layer (C layer) may also be formed, which may be considered as being included in a portion of the first carbon-containing layer.

Under the above-described processing conditions, the adsorption of the $C_3H_6$ gas accompanied by the substitution of the $NH_3$ gas with the $C_3H_6$ gas leads to the adsorption accompanied by the substitution (desorption) of not all but a portion of the $NH_3$ gas constituting the adsorption layer of the $NH_3$ gas. That is, all the $NH_3$ gas constituting the adsorption layer of the $NH_3$ gas is not substituted (desorbed), and a portion thereof maintains the adsorption state. In addition, the adsorption of the $C_3H_6$ gas not accompanied by the substitution of the $NH_3$ gas with the $C_3H_6$ gas becomes not continuous adsorption (saturated adsorption), which makes the uppermost surface of the wafer 200 be entirely covered, but discontinuous adsorption (unsaturated adsorption). Accordingly, the first carbon-containing layer formed in Step 1 becomes a layer having a thickness of less than one molecular layer, i.e., a discontinuous layer to cover only a portion of the uppermost surface of the wafer 200 modified by the $NH_3$ gas in the surface modification step. That is, the other portion of the uppermost surface of the wafer 200 modified by the $NH_3$ gas in the surface modification step is not covered with the first carbon-containing layer but intactly exposed even after the first carbon-containing layer is formed in Step 1, so that the other portion maintains a surface state where the HCDS gas supplied in Step 2 described later is easily adsorbed and Si is easily deposited.

For the adsorption of the $C_3H_6$ gas onto the uppermost surface of the wafer 200 to be unsaturated, the processing conditions in Step 1 need only be set to the above-described processing conditions. However, if the processing conditions in Step 1 are set to the following processing conditions, it becomes easy to unsaturate the adsorption of the $C_3H_6$ gas onto the uppermost surface of the wafer 200.

Wafer Temperature: 500 to 650 degrees C.
Internal Pressure of Process Chamber: 133 to 5332 Pa
Partial Pressure of $C_3H_6$ Gas: 33 to 5177 Pa
Supply Flow Rate of $C_3H_6$ Gas: 1000 to 10000 sccm
Supply Flow Rate of $N_2$ Gas: 300 to 3000 sccm
Supply Time of $C_3H_6$ Gas: 6 to 200 seconds (Residual Gas Removal)

After the first carbon-containing layer is formed, the valve 243b of the second gas supply pipe 232b is closed to stop the supply of the $C_3H_6$ gas. At this time, while the APC valve 244 of the exhaust pipe 231 is in an open state, the interior of the process chamber 201 is vacuum exhausted by the vacuum pump 246, and the $C_3H_6$ gas remaining in the process chamber 201 which does not react, reaction byproducts, or the $NH_3$ gas desorbed from the uppermost surface of the wafer 200 is removed from the process chamber 201. At this time, the valves 243f, 243e, 243g and 243f are in an open state, and the supply of the $N_2$ gas as the inert gas into the process chamber 201 is maintained. The $N_2$ gas acts as a purge gas, and thus, the $C_3H_6$ gas remaining in the process chamber 201 which does not react, reaction byproducts, or the $NH_3$ gas desorbed from the uppermost surface of the wafer 200 can be more effectively removed from the process chamber 201.

Moreover, in this case, the gas remaining in the process chamber 201 may not be completely removed, and the interior of the process chamber 201 may not be completely purged. When the gas remaining in the process chamber 201 is very small in amount, there is no adverse effect generated in Step 2 performed thereafter. Here, an amount of the $N_2$ gas supplied into the process chamber 201 need not be a large amount, and for example, approximately the same amount of the $N_2$ gas as the reaction tube 203 (the process chamber 201) may be supplied to perform the purge such that there is no adverse effect generated in Step 2. As described above, as the interior of the process chamber 201 is not completely purged, the purge time can be reduced, thereby improving the throughput. In addition, the consumption of the $N_2$ gas can also be suppressed to a minimal necessity.

The carbon-containing gas may include a hydrocarbon-based gas, such as acetylene ($C_2H_2$) gas or ethylene ($C_2H_4$) gas, in addition to the propylene ($C_3H_6$) gas.

[Step 2]

(HCDS Gas Supply)

After Step 1 is terminated and the residual gas in the process chamber 201 is removed, the valve 243a of the first gas supply pipe 232a is opened to flow the HCDS gas into the first gas supply pipe 232a. A flow rate of the HCDS gas flowing into the first gas supply pipe 232a is adjusted by the mass flow controller 241a. The flow rate-adjusted HCDS gas is supplied into the process chamber 201 through the gas supply holes 250a of the first nozzle 249a, and exhausted through the exhaust pipe 231. In this way, the HCDS gas is supplied to the wafer 200.

At the same time, the valve 243e is opened to flow the inert gas such as the $N_2$ gas into the first inert gas supply pipe 232e. A flow rate of the $N_2$ gas flowing in the first inert gas supply pipe 232e is adjusted by the mass flow controller 241e. The flow rate-adjusted $N_2$ gas is supplied into the process chamber 201 together with the HCDS gas, and exhausted through the exhaust pipe 231. Here, in order to prevent infiltration of the HCDS gas into the second nozzle 249b, the third nozzle 249c, the fourth nozzle 249d and the buffer chamber 237, the valves 243f, 243g and 243h are opened to flow the $N_2$ gas into the second inert gas supply pipe 232f, the third inert gas supply pipe 232g, and the fourth inert gas supply pipe 232h. The $N_2$ gas is supplied into the process chamber 201 through the second gas supply pipe 232b, the third gas supply pipe 232c, the fourth gas supply pipe 232d, the second nozzle 249b, the third nozzle 249c, the fourth nozzle 249d and the buffer chamber 237, and exhausted through the exhaust pipe 231.

In this case, the APC valve 244 is appropriately adjusted to set the internal pressure of the process chamber 201 to fall within a range of, for example, 1 to 13300 Pa, or more specifically, for example, 20 to 1330 Pa. A supply flow rate of the HCDS gas controlled by the mass flow controller 241a is set to fall within a range of, for example, 1 to 1000 sccm. A supply flow rate of the $N_2$ gas controlled by each of the mass flow controllers 241e, 241f, 241g and 241h is set to fall within a range of, for example, 100 to 10000 sccm. A duration for supplying the HCDS gas to the wafer 200, i.e., a gas supply time (irradiation time), is set to fall within a range of, for example, 1 to 200 seconds, specifically, for example, 1 to 120 seconds, or more specifically, for example, 1 to 60 seconds. At this time, a temperature of the heater 207 is the same temperature as in Step 1 and is set such that a CVD reaction is generated in the process chamber 210, i.e., a temperature of the wafer 200 becomes to fall within a range of, for example, 250 to 700 degrees C., or more specifically, for example, 300 to 650 degrees C. Also, when the temperature of the wafer 200 is less than 250 degrees C., the HCDS gas cannot be easily adsorbed onto the wafer 200 such that a practical film forming rate cannot be obtained. This problem can be solved by increasing the temperature of the wafer 200 to 250 degrees C. or more. Also, the HCDS gas can be more sufficiently adsorbed onto the wafer 200 by increasing the temperature of the wafer 200 to 300 degrees C. or more, and a more sufficient film forming rate can be obtained. Further, when the temperature of the wafer 200 exceeds 700 degrees C., film thickness uniformity may be easily deteriorated to make it difficult to control the film thickness uniformity as a CVD reaction is strengthened (a gaseous reaction becomes dominant). Deterioration of the film thickness uniformity can be suppressed, and thus, it is possible to control the film thickness uniformity by setting the temperature of the wafer 200 to 700 degrees C. or less. In particular, a surface reaction becomes dominant by setting the temperature of the wafer 200 to 650 degrees C. or less, the film thickness uniformity can be easily secured, and thus, it becomes easy to control the film thickness uniformity. Accordingly, the temperature of the wafer 200 may be set to fall within a range of 250 to 700 degrees C., or more specifically, for example, 300 to 650 degrees C.

The supply of the HCDS gas causes the silicon-containing layer having a thickness, for example, of less than one atomic layer to several atomic layers to be formed on the uppermost surface of the wafer 200 modified by the $NH_3$ gas in the surface modification step and having the first carbon-containing layer formed in the portion thereof. Accordingly, a first layer containing silicon and carbon, i.e., a layer including the first carbon-containing layer and the silicon-containing layer, is formed on the uppermost surface of the wafer 200. The silicon-containing layer may be an adsorption layer of the HCDS gas or a silicon layer (Si layer), or include both of them. However, the silicon-containing layer may be a layer containing silicon (Si) and chlorine (Cl).

Here, the silicon layer is a generic name including a discontinuous layer as well as a continuous layer constituted by silicon (Si), or a silicon thin film formed by laminating the discontinuous layer and the continuous layer constituted by Si. Also, in some cases, a continuous layer constituted by Si may be referred to as the silicon thin film. In addition, Si constituting the silicon layer includes Si, in which bonding to Cl is not completely broken.

Moreover, the adsorption layer of the HCDS gas includes a chemisorption layer in which gas molecules of the HCDS gas are discontinuous, in addition to a chemisorption layer in which the gas molecules of the HCDS gas are continuous. That is, the adsorption layer of the HCDS gas includes a chemisorption layer having a thickness of one molecular layer containing HCDS molecules or less than one molecular layer. Further, HCDS ($Si_2Cl_6$) molecules constituting the adsorption layer of the HCDS gas also contains molecules in which bonding of Si and Cl is partially broken ($Si_xCl_y$ molecules). That is, the adsorption layer of the HCDS includes a chemisorption layer in which $Si_2Cl_6$ molecules and/or $Si_xCl_y$ molecules are continuous, or a chemisorption layer in which $Si_2Cl_6$ molecules and/or $Si_xCl_y$ molecules are discontinuous. Also, a layer having a thickness of less than one atomic layer refers to a discontinuously formed atomic layer, and a layer having a thickness of one atomic layer refers to a continuously formed atomic layer. In addition, a layer having a thickness of less than one molecular layer refers to a discontinuously formed molecular layer, and a layer having a thickness of one molecular layer refers to a continuously formed molecular layer.

Under a condition in which the HCDS gas is autolyzed (pyrolyzed), i.e., under a condition in which a pyrolysis reaction of the HCDS gas occurs, the silicon layer is formed by depositing Si on the wafer 200. Under a condition in which the HCDS gas is not autolyzed (pyrolyzed), i.e., under a condition in which a pyrolysis reaction of the HCDS gas does not occur, the adsorption layer of the HCDS gas is formed by adsorbing the HCDS gas onto the wafer 200. In addition, forming the silicon layer on the wafer 200 can increase the film forming rate more than forming the adsorption layer of the HCDS gas on the wafer 200. When the thickness of the silicon-containing layer formed on the wafer 200 exceeds several atomic layers, an effect of modification in Steps 4 and 5 described later is not applied to the entire silicon-containing layer. In addition, a minimum value of the thickness of the silicon-containing layer that can be formed on the wafer 200 is less than one atomic layer. Accordingly, the thickness of the silicon-containing layer may be less than one atomic layer to several atomic layers. In addition, as the thickness of the silicon-containing layer is one atomic layer or less, i.e., one atomic layer or less than one atomic layer, an effect of the modification reaction in Steps 4 and 5 described later can be relatively increased, and thus the time required for the modification reaction in Steps 4 and 5 can be reduced. The time for forming the silicon-containing layer in Step 2 can be reduced. As a result, a processing time per one cycle can be reduced, and a total processing time can also be reduced. That is, the film forming rate can also be increased. In addition, as the thickness of the silicon-containing layer is one atomic layer or less, controllability of the film thickness uniformity can also be increased.

(Residual Gas Removal)

After the silicon-containing layer is formed, the valve 243a of the first gas supply pipe 232a is closed to stop the supply of the HCDS gas. At this time, while the APC valve 244 of the exhaust pipe 231 is in an open state, the interior of the process chamber 201 is vacuum exhausted by the vacuum pump 246, and the HCDS gas remaining in the process chamber 201 which does not react or remains after contributing to the formation of the silicon-containing layer or reaction byproducts are removed from the process chamber 201. At this time, the valves 243e, 243f, 243g and 243h are in an open state, and the supply of the $N_2$ gas as the inert gas into the process chamber 201 is maintained. The $N_2$ gas acts as a purge gas, and thus, the HCDS gas remaining in the process chamber 201 which does not react or remains after contributing to the formation of the silicon-containing layer or reaction byproducts can be more effectively removed from the process chamber 201.

Moreover, in this case, the gas remaining in the process chamber 201 may not be completely removed, and the interior of the process chamber 201 may not be completely purged. When the gas remaining in the process chamber 201 is very small in amount, there is no adverse effect generated in Step 3 performed thereafter. Here, an amount of the $N_2$ gas supplied into the process chamber 201 need not be a large amount, and for example, approximately the same amount of $N_2$ gas as the reaction tube 203 (the process chamber 201) may be supplied to perform the purge such that there is no adverse effect generated in Step 3. As described above, as the interior of the process chamber 201 is not completely purged, the purge time can be reduced, thereby improving the throughput. In addition, the consumption of the $N_2$ gas can also be suppressed to a minimal necessity.

The silicon-containing gas may include an inorganic precursor gas such as a tetrachlorosilane, i.e., silicon tetrachloride ($SiCl_4$, abbreviated to STC) gas, trichlorosilane ($SiHCl_3$, abbreviated to TCS) gas, dichlorosilane ($SiH_2Cl_2$, abbreviated to DCS) gas, monochlorosilane ($SiH_3Cl$, abbreviated to MCS) gas, monosilane ($SiH_4$) gas or the like, as well as an organic precursor gas such as an aminosilane-based gas, including tetrakis(dimethylamino)silane ($Si[N(CH_3)_2]_4$, abbreviated to 4DMAS) gas, tris(dimethylamino)silane ($Si[N(CH_3)_2]_3H$, abbreviated to 3DMAS) gas, bis(diethylamino)silane ($Si[N(C_2H_5)_2]_2H_2$, abbreviated to 2DEAS) gas, bis(tertiary-butylamino)silane ($SiH_2[NH(C_4H_9)]_2$, abbreviated to BTBAS) gas, or the like, in addition to the hexachlorodisilane ($Si_2Cl_6$, abbreviated to HCDS) gas. The inert gas may include a rare gas such as Ar gas, He gas, Ne gas, Xe gas, and the like, in addition to the N2 gas.

[Step 3]

($C_3H_6$ Gas Supply)

After Step 2 is terminated and the residual gas in the process chamber 201 is removed, the $C_3H_6$ gas activated by heat is supplied to the wafer 200. A processing sequence and processing conditions in this step are similar to the processing sequence and processing conditions when the $C_3H_6$ gas is supplied in the above-described Step 1.

In this embodiment, the gas flowing into the process chamber 201 is the thermally activated the $C_3H_6$ gas, and no HCDS gas is allowed to flow into the process chamber 201. Therefore, the $C_3H_6$ gas does not cause a gas phase reaction and is supplied in an activated state to the wafer 200. Further, as a second carbon-containing layer, a carbon-containing layer having a thickness of less than one molecular layer or less than one atomic layer, i.e., a discontinuous carbon-containing layer, is formed on the silicon-containing layer formed on the wafer 200 in Step 2. Accordingly, a second layer containing silicon and carbon, i.e., a layer including the first carbon-containing layer, the silicon-containing layer and the second carbon-containing layer, is formed on the uppermost surface of the wafer 200. In addition, depending on conditions, a portion of the silicon-containing layer reacts with the $C_3H_6$ gas supplied in Step 3 and the silicon-containing layer is modified (carbonized), so that in some cases, the second layer containing silicon and carbon, i.e., a layer including the first carbon-containing layer and the modified (carbonized) silicon-containing layer, may be formed on the uppermost surface of the wafer 200.

The second carbon-containing layer formed on the silicon-containing layer may be a chemisorption layer of the carbon-containing gas ($C_3H_6$ gas), a chemisorption layer of a substance ($C_xH_y$) produced by decomposing $C_3H_6$, or a carbon layer (C layer). Here, a chemisorption layer of $C_3H_6$ or $C_xH_y$ needs to be a discontinuous chemisorption layer of $C_3H_6$ molecules or $C_xH_y$ molecules. Also, the carbon layer needs to be a discontinuous layer constituted by carbon. In addition, when the second carbon-containing layer formed on the silicon-containing layer is a continuous layer, for example, when an adsorption of $C_3H_6$ or $C_xH_y$ onto the silicon-containing layer is saturated to form a continuous chemisorption layer of $C_3H_6$ or $C_xH_y$ on the silicon-containing layer, the surface of the silicon-containing layer is entirely covered with the chemisorption layer of $C_3H_6$ or $C_xH_y$. In such a case, no silicon exists on the surface of the second layer (the layer including the first carbon-containing layer, the silicon-containing layer and the second carbon-containing layer), resulting in difficulty in obtaining an oxidation reaction of the second layer in Step 4 described later or a nitridation reaction of the second layer in Step 5 described later, in some cases. This is the reason why under the processing conditions as described above, nitrogen or oxygen is bonded to silicon but is hardly bonded to carbon. In order to cause a desired oxidation or nitridation reaction in Step 4 or 5 described later, the adsorption of $C_3H_6$ or $C_xH_y$ onto the silicon-containing layer needs to be unsaturated to expose silicon in the surface of the second layer.

In order to unsaturate the adsorption of $C_3H_6$ or $C_xH_y$ onto the silicon-containing layer, the processing conditions in Step 3 need only be the above-described processing conditions. However, if the processing conditions in Step 3 are set to the following processing conditions, it becomes easy to unsaturate the adsorption of $C_3H_6$ or $C_xH_y$ onto the silicon-containing layer.

Wafer Temperature: 500 to 650 degrees C.
Internal Pressure of Process Chamber: 133 to 5332 Pa
Partial Pressure of $C_3H_6$ Gas: 33 to 5177 Pa
Supply Flow Rate of $C_3H_6$ Gas: 1000 to 10000 sccm
Supply Flow Rate of $N_2$ Gas: 300 to 3000 sccm
Supply Time of $C_3H_6$ Gas: 6 to 200 seconds (Residual Gas Removal)

After the second carbon-containing layer is formed, the valve 243b of the second gas supply pipe 232b is closed to stop the supply of the $C_3H_6$ gas. At this time, while the APC valve 244 of the exhaust pipe 231 is in an open state, the interior of the process chamber 201 is vacuum exhausted by the vacuum pump 246, and the $C_3H_6$ gas remaining in the process chamber 201 which does not react or remains after contributing to the formation of the second carbon-containing layer or reaction byproducts are removed from the process chamber 201. At this time, the valves 243f, 243e, 243g and 243f are in an open state, and the supply of the $N_2$ gas as the inert gas into the process chamber 201 is maintained. The $N_2$ gas acts as a purge gas, and thus, the $C_3H_6$ gas remaining in the process chamber 201 which does not react or remains after contributing to the formation of the second carbon-containing layer or reaction byproducts can be effectively removed from the process chamber 201.

Moreover, the gas remaining in the process chamber 201 may not be completely removed, and the interior of the process chamber 201 may not be completely purged. When the gas remaining in the process chamber 201 is very small in amount, there is no adverse effect generated in Step 4 performed thereafter. Here, an amount of the $N_2$ gas supplied into the process chamber 201 need not be a large amount, and for example, approximately the same amount of the $N_2$ gas as the reaction tube 203 (the process chamber 201) may be supplied to perform the purge such that there is no adverse effect generated in Step 4. As described above, as the interior of the process chamber 201 is not completely purged, the purge time can be reduced, thereby improving the throughput. In addition, the consumption of the $N_2$ gas can also be suppressed to a minimal necessity.

The carbon-containing gas may include a hydrocarbon-based gas, such as acetylene ($C_2H_2$) gas or ethylene ($C_2H_4$) gas, in addition to the propylene ($C_3H_6$) gas.

[Step 4]
($O_2$ Gas Supply)

After Step 3 is terminated and the residual gas in the process chamber 201 is removed, the valve 243c of the third gas supply pipe 232c is opened to flow the $O_2$ gas into the third gas supply pipe 232c. A flow rate of the $O_2$ gas flowing in the third gas supply pipe 232c is adjusted by the mass flow controller 241c. The flow rate-adjusted $O_2$ gas is supplied into the process chamber 201 through the gas supply holes 250c of the third nozzle 249c. The $O_2$ gas supplied into the process chamber 201 is activated by heat and exhausted through the exhaust pipe 231. In this way, the $O_2$ gas activated by heat is supplied to the wafer 200.

At the same time, the valve 243g is opened to flow the $N_2$ gas into the third inert gas supply pipe 232g. The $N_2$ gas flowing in the third inert gas supply pipe 232g is supplied into the process chamber 201 together with the $O_2$ gas, and exhausted through the exhaust pipe 231. Here, in order to prevent infiltration of the $O_2$ gas into the first nozzle 249a, the second nozzle 249b, the fourth nozzle 249d, and the buffer chamber 237, the valves 243e, 243f and 243h are opened to flow the $N_2$ gas into the first inert gas supply pipe 232e, the second inert gas supply pipe 232f, and the fourth inert gas supply pipe 232h. The $N_2$ gas is supplied into the process chamber 201 through the first gas supply pipe 232a, the second gas supply pipe 232b, the fourth gas supply pipe 232d, the first nozzle 249a, the second nozzle 249b, the fourth nozzle 249d, and the buffer chamber 237, and exhausted through the exhaust pipe 231.

Here, the APC valve 244 is appropriately adjusted to set the internal pressure of the process chamber 201 to fall within a range of, for example, 1 to 6000 Pa. A supply flow rate of the $O_2$ gas controlled by the mass flow controller 241c is set to fall within a range of, for example, 100 to 10000 sccm. A supply flow rate of the $N_2$ gas controlled by each of the mass flow controllers 241g, 241e, 241f and 241h is set to fall within a range of, for example, 100 to 10000 sccm. Here, a partial pressure of the $O_2$ gas in the process chamber 201 is set to fall within a range of, for example, 0.01 to 5941 Pa. A duration for supplying the $O_2$ gas to the wafer 200, i.e., a gas supply time (irradiation time), is set to fall within a range of, for example, 1 to 200 seconds, specifically, for example, 1 to 120 seconds, or more specifically, for example, 1 to 60 seconds. In this case, in the same way as Steps 1 to 3, a temperature of the heater 207 is set such that a temperature of the wafer 200 falls within a range of, for example, 250 to 700 degrees C., or more specifically, for example, 300 to 650 degrees C. The $O_2$ gas is thermally activated under the same conditions as above. In addition, since the $O_2$ gas is activated by heat and supplied to generate a soft reaction, the oxidation described later can be gently performed.

Here, the gas flowing into the process chamber 201 is the thermally activated $O_2$ gas, and none of the HCDS gas and the $C_3H_6$ gas is allowed to flow into the process chamber 201. Therefore, the $O_2$ gas does not cause a gas phase reaction, and the activated $O_2$ gas is supplied to the wafer 200 and reacts with at least a portion of the second layer containing silicon and carbon (the layer including the first carbon-containing layer, the silicon-containing layer and the second carbon-containing layer) formed on the wafer 200 in Step 3. Accordingly, the second layer is thermally oxidized in a non-plasma environment to be changed (modified) to a third layer containing silicon, oxygen and carbon, i.e., a silicon oxycarbide layer (SiOC layer).

Here, the oxidation reaction of the second layer should not be saturated. For example, when the first carbon-containing layer having a thickness of less than one atomic layer is formed in Step 1, the silicon-containing layer having a thickness of several atomic layers is formed in Step 2, and the second carbon-containing layer having a thickness of less than one atomic layer is formed in Step 3, at least a portion of the surface layer (one atomic layer of the surface) thereof is allowed to be oxidized. In this case, in order not to oxidize the entire second layer, the oxidation is performed under conditions in which the oxidation reaction of the second layer is unsaturated. Further, depending on conditions, the oxidation may occur from the surface layer of the second layer to several layers therebelow. However, it is preferable to oxidize only the surface layer since controllability of a composition ratio of the SiOCN film can be improved. In addition, for example, when the first carbon-containing layer having a thickness of less than one atomic layer is formed in Step 1, the silicon-containing layer having a thickness of one atomic layer or less than one atomic layer is formed in Step 2, and the second carbon-containing layer having a thickness of less than one atomic layer is formed in Step 3, a portion of its surface layer is also allowed to be oxidized. Even in such a case, in order not to oxidize the entire second layer, the oxidation is performed under conditions in which the oxidation reaction of the second layer is unsaturated.

Further, for the oxidation reaction of the second layer to be unsaturated, the processing conditions in Step 4 need only be set to the above-described processing conditions. However, if the processing conditions in Step 4 are set to the following processing conditions, the oxidation reaction of the second layer is easily unsaturated.

Wafer Temperature: 500 to 650 degrees C.
Internal Pressure of Process Chamber: 133 to 5332 Pa
Partial Pressure of $O_2$ Gas: 12 to 5030 Pa Supply Flow Rate of $O_2$ Gas: 1000 to 5000 sccm
Supply Flow Rate of $N_2$ Gas: 300 to 10000 sccm
Supply Time of $O_2$ Gas: 6 to 200 seconds In this embodiment, particularly, oxidizing power in Step 4 can be appropriately reduced by adjusting the above-described processing conditions to increase a dilution rate of the $O_2$ gas (reduce a concentration of the $O_2$ gas), reduce a supply time of the $O_2$ gas, or reduce a partial pressure of the $O_2$ gas. As a result, it becomes easier for the oxidation reaction of the second layer to be unsaturated. The film forming sequence of FIG. 4A illustrates that a partial pressure of the $O_2$ gas is reduced and the oxidizing power is reduced by setting a supply flow rate of the $N_2$ gas supplied in Step 4 to be larger than a supply flow rate of the $N_2$ gas supplied in the other steps.

It is easy to suppress the desorption of carbon (C) from the second layer in the oxidation process by reducing the oxidizing power in Step 4. Since a Si—O bonding has bonding energy higher than a Si—C bonding, the Si—C bonding tends to be broken when the Si—O bonding is formed. However, it is possible to prevent the Si—C bonding from being broken when the Si—O bonding is formed in the second layer by properly reducing the oxidizing power in Step 4. Thus, it is easy to prevent C, in which bonding to Si is broken, from being desorbed from the second layer.

In addition, it is possible to maintain an exposed state of Si in the second layer after the oxidation, i.e., the uppermost surface of the third layer, by reducing the oxidizing power in Step 4. As the exposed state of Si in the uppermost surface of the third layer is maintained, it becomes easy to nitride the uppermost surface of the third layer in Step 5 described later. If the Si—O bonding or the Si—C bonding is formed over the entire uppermost surface of the third layer and Si is not exposed in the uppermost surface, the Si—N bonding tends to be hardly formed under conditions of Step 5 described later. However, it is easy to form the Si—N bonding by maintaining the exposed state of Si in the uppermost surface of the third layer, i.e., by allowing Si capable of being bonded to Ni under the conditions of Step 5 described later to exist in the uppermost surface of the third layer.

(Residual Gas Removal)

After the third layer is formed, the valve 243c of the third gas supply pipe 232c is closed to stop the supply of the $O_2$ gas. At this time, while the APC valve 244 of the exhaust pipe 231 is in an open state, the interior of the process chamber 201 is vacuum exhausted by the vacuum pump 246, and the $O_2$ gas remaining in the process chamber 201 which does not react or remains after contributing to the formation of the third layer or reaction byproducts are removed from the process chamber 201. At this time, the valves 243g, 243e, 243f and 243h are in an open state, and the supply of the $N_2$ gas as the inert gas into the process chamber 201 is maintained. The $N_2$ gas acts as a purge gas, and thus, the $O_2$ gas remaining in the process chamber 201 which does not react or remains after contributing to the formation of the third layer or reaction byproducts can be more effectively removed from the process chamber 201.

Moreover, in this case, the gas remaining in the process chamber 201 may not be completely removed, and the interior of the process chamber 201 may not be completely purged. When the gas remaining in the process chamber 201 is very small in amount, there is no adverse effect generated in Step 5 performed thereafter. Here, an amount of the $N_2$ gas supplied into the process chamber 201 need not be a large amount, and for example, approximately the same amount of the $N_2$ gas as the reaction tube 203 (the process chamber 201) may be supplied to perform the purge such that there is no adverse effect generated in Step 5. As described above, as the interior of the process chamber 201 is not completely purged, the purge time can be reduced, thereby improving the throughput. In addition, the consumption of the $N_2$ gas can also be suppressed to a minimal necessity.

The oxidizing gas may include water vapor ($H_2O$) gas, nitrogen monoxide (NO) gas, nitrous oxide ($N_2O$) gas, nitrogen dioxide ($NO_2$) gas, carbon monoxide (CO) gas, carbon dioxide ($CO_2$) gas, ozone ($O_3$) gas, hydrogen ($H_2$) gas+$O_2$ gas, $H_2$ gas+$O_3$ gas, and the like, in addition to the oxygen ($O_2$) gas.

[Step 5]
($NH_3$ Gas Supply)

After Step 4 is terminated and the residual gas in the process chamber 201 is removed, the $NH_3$ gas activated by heat is supplied to the wafer 200. A processing sequence and processing conditions in this step are almost the same to the processing sequence and processing conditions when the $NH_3$ gas is supplied in the above-described surface modification step. However, a duration for supplying the $NH_3$ gas to the wafer 200, i.e., a gas supply time (irradiation time), is set to fall within a range of, for example, 1 to 200 seconds, specifically, for example, 1 to 120 seconds, or more specifically, for example, 1 to 60 seconds. Also, in Step 5, the $NH_3$ gas is activated by heat and supplied. Since the $NH_3$ gas is activated by heat and supplied to generate a soft reaction, the nitriding described later can be softly performed. However, in the same way as the above-described surface modification step, the $NH_3$ gas may be activated to plasma and supplied.

Here, the gas flowing into the process chamber 201 is the thermally activated $NH_3$ gas, and none of the HCDS gas, the $C_3H_6$ gas and the $O_2$ gas is allowed to flow into the process chamber 201. Therefore, the $NH_3$ gas does not cause a gas phase reaction, and the activated $NH_3$ gas is supplied to the wafer 200 and reacts with at least a portion of the layer containing silicon, oxygen and carbon, as the third layer, formed on the wafer 200 in Step 4. Accordingly, the third layer is thermally nitrided in a non-plasma environment to be changed (modified) to a fourth layer containing silicon, oxygen, carbon and nitrogen, i.e., a silicon oxycarbonitride layer (SiOCN layer).

Further, in a process of nitriding the third layer by supplying the activated $NH_3$ gas to the wafer 200, the uppermost surface of the third layer is modified (surface modification processing). Specifically, as the $NH_3$ gas is adsorbed onto the uppermost surface of the third layer, the adsorption layer of the $NH_3$ gas is formed on the uppermost surface of the third layer, i.e., the uppermost surface of the fourth layer. Also, in that time, as the uppermost surface of the third layer reacts with the activated $NH_3$ gas to be modified, in some cases, a layer having Si—N bonding, i.e., a nitride layer containing silicon (Si) and nitrogen (N) (silicon nitride layer) may be further formed on the uppermost surface of the third layer, i.e., the uppermost surface of the fourth layer. That is, in some cases, both the nitride layer and the adsorption layer of the $NH_3$ gas may be formed on the uppermost surface of the third layer, i.e., the uppermost surface of the fourth layer.

The uppermost surface of the third layer after the surface modification processing is performed in the nitriding process, i.e., the uppermost surface of the fourth layer, is changed into a surface state in which the HCDS gas to be supplied in a next cycle is easily adsorbed and Si is easily deposited. That is, the $NH_3$ gas used in Step 5 acts as an adsorption and deposition facilitating gas that facilitates adsorption or deposition of the HCDS gas or Si onto the uppermost surface of the fourth layer (the uppermost surface of the wafer 200) in the next cycle.

In this embodiment, the nitridation reaction of the third layer should not be saturated. For example, when the third layer having a thickness of several atomic layers is formed in Steps 1 to 4, at least a portion of the surface layer (one atomic layer of the surface) is allowed to be nitrided. In this case, in order not to nitride the entire of the third layer, the nitridation is performed under conditions in which the oxidation reaction of the third layer is unsaturated. Further, depending on conditions, the nitridation may be allowed to occur from the surface layer of the third layer to several layers therebelow. However, it is possible to nitride only the surface layer since controllability of a composition ratio of the SiOCN film can be improved thereby. In addition, for example, when the third layer having a thickness of one atomic layer or less than one atomic layer is formed in Steps 1 to 4, a portion of its surface layer is also allowed to be nitrided. Even in such a case, in order not to nitride the entire of the third layer, the nitridation is performed under conditions in which the nitridation reaction of the third layer is unsaturated.

Further, in order that the nitridation reaction of the third layer is unsaturated, the processing conditions in Step 5 need only be set to the above-described processing conditions. However, if the processing conditions in Step 5 are set to the following processing conditions, the nitridation reaction of the third layer is easily unsaturated.

Wafer Temperature: 500 to 650 degrees C.
Internal Pressure of Process Chamber: 133 to 5332 Pa
Partial Pressure of $NH_3$ Gas: 33 to 5030 Pa
Supply Flow Rate of $NH_3$ Gas: 1000 to 5000 sccm
Supply Flow Rate of $N_2$ Gas: 300 to 3000 sccm
Supply Time of $NH_3$ Gas: 6 to 200 seconds
(Residual Gas Removal)

After the fourth layer is formed, the interior of the process chamber 201 is vacuum exhausted, and the $NH_3$ gas remaining in the process chamber 201 which does not react or remains after contributing to the formation of the fourth layer or reaction byproducts are removed from the process chamber 201. A processing sequence and processing conditions in this step are similar to the processing sequence and processing conditions when the residual gas is removed in the above-described surface modification step.

In the same way as the surface modification step, the nitriding gas may include diazene ($N_2H_2$) gas, hydrazine ($N_2H_4$) gas, $N_3H_8$ gas, and the like, in addition to the ammonia ($NH_3$) gas.

The above-described Steps 1 to 5 may be set as one cycle and the cycle may be performed once or more (i.e., a predetermined number of times) to form a thin film containing silicon, oxygen, carbon and nitrogen, i.e., a silicon oxycarbonitride film (SiOCN film), having a predetermined film thickness. Also, the above-described cycle may be performed multiple times. That is, it is possible that a thickness of the SiOCN layer formed per cycle be set to be smaller than a desired film thickness, and the above-described cycle be repeated multiple times until the desired film thickness is obtained.

Further, when the cycle is performed multiple times, in Step 1 during and after the second cycle, the phrase "the first carbon-containing layer is formed in a portion of the uppermost surface of the wafer 200 modified by the $NH_3$ gas in the surface modification step" means that "the first carbon-containing layer is formed in a portion of the uppermost surface of the third layer modified by the $NH_3$ gas in Step 5, i.e., the uppermost surface of the fourth layer," and the phrase "at least a portion of the first carbon-containing layer is formed in such a manner that a portion of the $NH_3$ gas adsorbed onto at least a portion of the uppermost surface of the wafer 200 modified by the $NH_3$ gas in the surface modification step is substituted by the $C_3H_6$ gas" means that "at least a portion of the first carbon-containing layer is formed in such a manner that a portion of the $NH_3$ gas adsorbed onto at least a portion of the uppermost surface of the third layer modified by the $NH_3$ gas in the Step 5, i.e., the uppermost surface of the fourth layer, is substituted by the $C_3H_6$ gas."

That is, when the cycle is performed multiple times, the phrase "a predetermined gas is supplied to the wafer 200" in each step during and after at least the second cycle means that a predetermined gas is supplied to a layer formed on the wafer 200, i.e., the uppermost surface of the wafer 200, which is a laminated body. The phrase "a predetermined layer is formed on the wafer 200" means that a predetermined layer is formed on a layer formed on the wafer 200, i.e., the uppermost surface of the wafer 200, which is a laminated body. Also, above-described matters are similar in other film forming sequences or their respective modifications described later.

In addition, when the SiOCN film is formed in the film forming sequence, the $C_3H_6$ gas is allowed to be supplied twice per cycle (through the separate two steps). That is, the $C_3H_6$ gas is allowed to be supplied twice, i.e., before and after Step 2 in which the HCDS gas is supplied (i.e., in Steps 1 and 3). Accordingly, it is possible to control the nitrogen (N) concentration and the carbon (C) concentration in the SiOCN film. For example, it is possible to increase the C concentration by reducing the N concentration in the SiOCN film.

Further, when the SiOCN film is formed in the film forming sequence, ratios of the respective element components, i.e., the silicon component, the oxygen component, the carbon component, and the nitrogen component, i.e., the silicon concentration, the oxygen concentration, the carbon concentration, and the nitrogen concentration, in the SiOCN layer, can be adjusted and a composition ratio of the SiOCN film can be controlled by controlling the processing conditions such as the internal pressure of the process chamber 201 or the gas supply time in each step.

For example, it is possible to control the amount of desorption of the $NH_3$ gas from the adsorption layer of the $NH_3$ gas formed on the modified uppermost surface of the wafer 200 (or the uppermost surface of the fourth layer) or the amount of adsorption of the $C_3H_6$ gas onto the modified uppermost surface of the wafer 200 (or the uppermost surface of the fourth layer) by controlling the gas supply time of the $C_3H_6$ gas in Step 1 or the partial pressure or concentration of the $C_3H_6$ gas in the process chamber 201 in Step 1. Accordingly, it is possible to finely adjust the N concentration and the C concentration in the SiOCN film. For example, it is possible to increase the amount of desorption of the $NH_3$ gas from the adsorption layer of the $NH_3$ gas formed on the modified uppermost surface of the wafer 200 (or the uppermost surface of the fourth layer) or to increase the amount of adsorption of the $C_3H_6$ gas onto the modified uppermost surface of the wafer 200 (or the uppermost surface of the fourth layer) by increasing the gas supply time of the $C_3H_6$ gas in Step 1 or increasing the partial pressure or concentration of the $C_3H_6$ gas in the process chamber 201 in Step 1. Accordingly, it is possible to increase the C concentration by reducing the N concentration in the SiOCN film. However, if the gas supply time of the $C_3H_6$ gas in Step 1 is excessively long, it is also considered that a film forming rate of the SiOCN film is reduced. Accordingly, the gas supply time of the $C_3H_6$ gas in Step 1 may be set to be equal to or shorter than the gas supply time of the $C_3H_6$ gas in Step 3, for example.

In addition, for example, it is possible to control the amount of adsorption of the $C_3H_6$ gas onto the uppermost surface of the wafer 200 (or the uppermost surface of the first layer) in Step 3 or the amount of oxidation in Step 4 by controlling the gas supply time of the $C_3H_6$ gas in Step 3 or the partial pressure or concentration of the $C_3H_6$ gas in the process chamber 201 in Step 3. Accordingly, it is possible to finely adjust the C concentration and the O concentration in the SiOCN film. For example, it is possible to properly perform the oxidation reaction in Step 4 since an appropriately exposed state of silicon in the surface of the second layer can be maintained by adjusting the gas supply time or the partial pressure or concentration of the $C_3H_6$ gas to a suitable value in Step 3 to make the adsorption of $C_3H_6$ onto the silicon-containing layer be appropriately unsaturated, i.e., to make the second carbon-containing layer be an appropriate discontinuous layer.

Consequently, it is possible to appropriately control the O concentration, the C concentration, and the N concentration in the SiOCN film. For example, it is possible to increase the C concentration by reducing the N concentration while suppressing a reduction in the O concentration in SiOCN film. In addition, for example, even when the film forming temperature of the SiOCN film is lowered, it is possible to suppress an increase in the dielectric constant of the SiOCN film or reduce the dielectric constant of the SiOCN film.

(Purge and Return to Atmospheric Pressure)

When the film forming processing of forming the SiOCN film having a predetermined film thickness and a predetermined composition is performed, the inert gas such as the $N_2$ gas is supplied into the process chamber 201 and exhausted, whereby the interior of the process chamber 201 is purged with the inert gas (gas purge). Thereafter, an atmosphere in the process chamber 201 is substituted with the inert gas (inert gas substitution), and the internal pressure of the process chamber 201 returns to the normal pressure (return to atmospheric pressure).

(Boat Unloading and Wafer Discharging)

Thereafter, the seal cap 219 is lowered by the boat elevator 115 to open the lower end of the reaction tube 203, and the processed wafer 200 supported by the boat 217 is unloaded to the outside of the reaction tube 203 through the lower end of the reaction tube 203 (boat unloading). Then, the processed wafer 200 is discharged from the boat 217 (wafer discharging).

(Second Sequence)

Next, a second sequence of the embodiment will be described.

FIG. 5A is a view illustrating gas supply timings in the second sequence of the embodiment.

The second sequence of the embodiment is different from the above-described first sequence in that a thin film containing the predetermined element, oxygen, carbon and nitrogen is formed on the a wafer 200 by performing a cycle a predetermined number of times, the cycle including performing the following steps in the following order:

supplying a nitriding gas to the wafer 200;
supplying a carbon-containing gas to the wafer 200;
supplying a predetermined element-containing gas to the wafer 200;
supplying the carbon-containing gas to the wafer 200; and
supplying an oxidizing gas to the wafer 200.

In addition, the second sequence of the embodiment is different from the above-described first sequence in that the process of forming the thin film further includes a step of supplying the nitriding gas to the wafer 200 after the above-described cycle is performed a predetermined number of times.

That is, the second sequence of the embodiment is different from the above-described first sequence in that a thin film containing the predetermined element, oxygen, carbon and nitrogen is formed on the wafer 200 by performing a cycle a predetermined number of times and then performing a step of supplying a nitriding gas to the wafer 200, the cycle including performing the following steps in the following order:

supplying the nitriding gas to the wafer 200;
supplying a carbon-containing gas to the wafer 200;
supplying a predetermined element-containing gas to the wafer 200;
supplying the carbon-containing gas to the wafer 200; and
supplying an oxidizing gas to the wafer 200.

Hereinafter, the second sequence of the embodiment will be described. Here, HCDS gas is used as the predetermined element-containing gas, $C_3H_6$ gas is used as the carbon-containing gas, $O_2$ gas is used as the oxidizing gas, and $NH_3$ gas is used as the nitriding gas, and a silicon oxycarbonitride film (SiOCN film) containing silicon, oxygen, carbon and nitrogen is formed on the wafer 200 by the film forming sequence of FIG. 5A, i.e., the film forming sequence of performing a cycle a predetermined number of times and then performing a step of supplying $NH_3$ gas to the wafer 200, the cycle including performing the following steps in the following order: supplying the $NH_3$ gas, supplying $C_3H_6$ gas, supplying HCDS gas, supplying the $C_3H_6$ gas, and supplying $O_2$ gas.

(Wafer Charging and Wafer Rotation)

Wafer charging, boat loading, pressure adjustment, temperature adjustment, and wafer rotation are performed in the same way as the first sequence.

[Process of Forming Silicon Oxycarbonitride Film]

Five steps described later, i.e., Steps 1 to 5 are set as one cycle. The cycle is performed once or more, and then a nitriding step described later is performed.

[Step 1]

Step 1 of the second sequence is performed similarly to the surface modification step or Step 5 of the first sequence. A processing sequence and processing conditions in Step 1 of the second sequence are similar to the processing sequence and processing conditions in the surface modification step or Step 5 of the first sequence.

Also, a reaction caused, a layer formed, and the like in Step 1 in the first cycle of the second sequence are similar to those in the surface modification step of the first sequence. That is, in this step, the uppermost surface of the wafer 200 is changed (modified) into a surface state, in which the HCDS gas is easily adsorbed and Si is easily deposited, by supplying the activated $NH_3$ gas to the uppermost surface (base surface when the SiOCN film is formed) of the wafer 200. In other words, the adsorption layer of the $NH_3$ gas is formed on the uppermost surface of the wafer 200. Furthermore, in some cases, a nitride layer containing Si and N may be formed on the uppermost surface of the wafer 200.

In addition, when the cycle is performed a plurality of times, a reaction caused, a layer formed, and the like in Step 1 during and after the second cycle of the second sequence are similar to those in Step 5 of the first sequence. That is, in this step, a fourth layer containing silicon, oxygen, carbon and nitrogen is formed on the wafer 200 by supplying the NH$_3$ gas into the process chamber 201 to nitride at least a portion of a third layer formed in Step 5 described later. Also, in this step, the uppermost surface of the fourth layer which is formed by nitriding the third layer is changed (modified) into a surface state, in which the HCDS gas is easily adsorbed and Si is easily deposited, by supplying the activated NH$_3$ gas to the surface of the third layer. That is, the adsorption layer of the NH$_3$ gas is formed on the uppermost surface of the fourth layer. Also, in some cases, along with the adsorption layer of the NH$_3$ gas, a nitride layer containing Si and N may be further formed on the uppermost surface of the fourth layer.

[Step 2]

Step 2 of the second sequence is performed similarly to Step 1 of the first sequence. A processing sequence, processing conditions, a reaction caused, a layer formed, and the like in Step 2 of the second sequence are similar to those in Step 1 of the first sequence. That is, in this step, a first carbon-containing layer is formed on the uppermost surface of the wafer 200 modified by supplying the NH$_3$ gas (or the uppermost surface of the fourth layer) by supplying the C$_3$H$_6$ gas into the process chamber 201.

The first carbon-containing layer becomes a layer having a thickness of less than one molecular layer, i.e., a discontinuous layer, to cover only a portion of the uppermost surface of the wafer 200 modified by the NH$_3$ gas in Step 1 (or the uppermost surface of the fourth layer). That is, the other portion of the uppermost surface of the wafer 200 modified by the NH$_3$ gas in Step 1 (or the uppermost surface of the fourth layer) is not covered with the first carbon-containing layer to be intactly exposed and maintains a surface state in which the HCDS gas supplied in Step 3 described later is easily adsorbed and Si is easily deposited.

[Step 3]

Step 3 of the second sequence is performed similarly to Step 2 of the first sequence. A processing sequence, processing conditions, a reaction caused, a layer formed, and the like in Step 3 of the second sequence are similar to those in Step 2 of the first sequence. That is, in this step, a silicon-containing layer having a thickness of, for example, less than one atomic layer to several atomic layers, is formed on the uppermost surface of the wafer 200 modified by the supply of the NH$_3$ gas and having the first carbon-containing layer formed in the portion thereof (or the uppermost surface of the fourth layer) by supplying the HCDS gas into the process chamber 201. Accordingly, a first layer containing silicon and carbon, i.e., a layer including the first carbon-containing layer and the silicon-containing layer, is formed on the uppermost surface of the wafer 200 (or the uppermost surface of the fourth layer).

[Step 4]

Step 4 of the second sequence is performed similarly to Step 3 of the first sequence. A processing sequence, processing conditions, a reaction caused, a layer formed, and the like in Step 4 of the second sequence are similar to those in Step 3 of the first sequence. That is, in this step, a second carbon-containing layer is formed on the silicon-containing layer formed in Step 3 by supplying C$_3$H$_6$ gas into the process chamber 201. Accordingly, a second layer containing silicon and carbon, i.e., a layer including the first carbon-containing layer, the silicon-containing layer and the second carbon-containing layer, is formed on the uppermost surface of the wafer 200 (or the uppermost surface of the fourth layer).

[Step 5]

Step 5 of the second sequence is performed similarly to Step 4 of the first sequence. A processing sequence, processing conditions, a reaction caused, a layer formed, and the like in Step 5 of the second sequence are similar to those in Step 4 of the first sequence. That is, in this step, a third layer containing silicon, oxygen and carbon is formed on the wafer 200 by supplying the O$_2$ gas into the process chamber 201 to oxidize at least a portion of the second layer (the layer including the first carbon-containing layer, the silicon-containing layer and the second carbon-containing layer).

The above-described Steps 1 to 5 may be set as one cycle and the cycle may be performed once or more to form a SiOCN film having a predetermined film thickness. Also, the above-described cycle may be performed a plurality of times. That is, it is possible that a thickness of the SiOCN layer formed per cycle may be set to be smaller than a desired film thickness, and the above-described cycle may be repeated a plurality of times until the desired film thickness is obtained.

In addition, when the SiOCN film is formed in this film forming sequence, the C$_3$H$_6$ gas is allowed to be supplied twice per cycle (through the separate two steps). That is, the C$_3$H$_6$ gas is allowed to be supplied twice, i.e., before and after Step 3 in which the HCDS gas is supplied (i.e., in Steps 2 and 4). Accordingly, it is possible to control the nitrogen (N) concentration and the carbon (C) concentration in the SiOCN film.

Further, when the SiOCN film is formed in this film forming sequence, ratios of the silicon component, the oxygen component, the carbon component, and the nitrogen component in the SiOCN layer can be adjusted, and a composition ratio of the SiOCN film can be controlled by controlling the processing conditions such as the internal pressure of the process chamber 201 or the gas supply time in each step. For example, it is possible to finely adjust the N concentration and the C concentration in the SiOCN film by controlling the gas supply time of the C$_3$H$_6$ gas in Step 2 or the partial pressure or concentration of the C$_3$H$_6$ gas in the process chamber 201 in Step 2. In addition, for example, it is possible to finely adjust the C concentration and the O concentration in the SiOCN film by controlling the gas supply time of the C$_3$H$_6$ gas in Step 4 or the partial pressure or concentration of the C$_3$H$_6$ gas in the process chamber 201 in Step 4. Consequently, it is possible to control the O concentration, the C concentration, and the N concentration in the SiOCN film.

Also, the third layer, i.e., the SiOC layer, is formed on the uppermost surface of the SiOCN film formed in this process.

[Nitriding Step]

After the Steps 1 to 5 are set as one cycle and the cycle is performed a predetermined number of times, the nitriding step is performed. The nitriding step of the second sequence is performed similarly to Step 5 of the first sequence. A processing sequence, processing conditions, a reaction caused, a layer formed, and the like in the nitriding step of the second sequence are similar to those in Step 5 of the first sequence. That is, in this step, the third layer is changed (modified) into the fourth layer, i.e., a SiOCN layer, by supplying the NH$_3$ gas into the process chamber 201 to nitride at least a portion of the third layer (SiOC layer) formed on the uppermost surface of the wafer 200 in the previous cycle. As the uppermost surface of the SiOCN film is appropriately nitrided and modified by the nitriding step, the SiOCN film becomes a film formed by laminating SiOCN layers from a lowermost layer to an uppermost layer.

That is, the SiOCN film is a film having a uniform composition in the film thickness direction.

(Gas Purge to Wafer Discharging)

After the formation of the SiOCN film and the modification of the uppermost surface of the SiOCN film are performed, the gas purging, the substitution with the inert gas, the returning to the atmospheric pressure, the boat unloading, and the wafer discharging are performed similarly to the first sequence.

(3) Effects According to the Embodiment

According to the embodiment, one or a plurality of effects is provided as described below.

(a) According to the embodiment, in either of the film forming sequences, before the silicon-containing layer is formed by supplying the HCDS gas to the wafer 200, a process of modifying the uppermost surface of the wafer 200 into a surface state, in which the HCDS gas is easily adsorbed and Si is easily deposited, by supplying the $NH_3$ gas to the wafer 200 and a process of forming the first carbon-containing layer in a portion of the uppermost surface of the wafer 200 by supplying the $C_3H_6$ gas to the wafer 200 are performed in this order. In addition, the first carbon-containing layer is made a discontinuous layer which covers only the portion of the uppermost surface of the wafer 200 modified by the $NH_3$ gas. That is, the other portion of the uppermost surface of the wafer 200 modified by the $NH_3$ gas is not covered with the first carbon-containing layer, and is in an exposed state as it is to maintain a surface state in which the HCDS gas is easily adsorbed and Si is easily deposited. In addition, until the process of supplying the HCDS gas after the process of forming the first carbon-containing layer, no other process is performed. Accordingly, the film forming rate of the SiOCN film can be increased, thereby improving productivity of the film forming process even in a low temperature range.

That is, in the first sequence, Steps 1 to 5 are set as one cycle and the cycle is performed a predetermined number of times, after the surface modification step, in which the uppermost surface of the wafer 200 is modified into a surface state in which the HCDS gas is easily adsorbed and Si is easily deposited, is performed. Here, the first carbon-containing layer formed in Step 1 is made a discontinuous layer, which covers only a portion of the uppermost surface of the wafer 200 which is modified. Also, Step 3 of supplying the $C_3H_6$ gas and Step 4 of supplying the $O_2$ gas are not performed between Steps 1 and 2. As Step 3 or 4 is not performed between Steps 1 and 2, the other portion (the exposed surface) of the uppermost surface of the wafer 200, which is not covered with the first carbon-containing layer, maintains a surface state in which the HCDS gas is easily adsorbed and Si is easily deposited. Accordingly, in Step 2, it is preferred to perform the adsorption of the HCDS gas or the deposition of Si onto the uppermost surface of the wafer 200, thereby facilitating the formation of the silicon-containing layer on the uppermost surface of the wafer 200.

Also, in the first sequence, when Steps 1 to 5 are set as one cycle and the cycle is performed a plurality of times, in the respective steps during and after the second cycle, Step 5 of modifying the uppermost surface of the fourth layer into a surface state in which the HCDS gas is easily adsorbed and Si is easily deposited, Step 1 of forming the first carbon-containing layer, and Step 2 of forming the silicon-containing layer are sequentially performed in this order. Here, the first carbon-containing layer formed in Step 1 is made a discontinuous layer, which covers only a portion of the uppermost surface of the fourth layer which is modified. Also, Step 3 of supplying the $C_3H_6$ gas and Step 4 of supplying the $O_2$ gas are not performed between Steps 1 and 2. As Step 3 or 4 is not performed between Steps 1 and 2, the other portion (the exposed surface) of the uppermost surface of the fourth layer, which is not covered with the first carbon-containing layer, maintains a surface state in which the HCDS gas is easily adsorbed and Si is easily deposited. Accordingly, in Step 2, it is preferred to perform the adsorption of the HCDS gas or the deposition of Si onto the uppermost surface of the fourth layer, thereby facilitating the formation of the silicon-containing layer on the uppermost surface of the fourth layer.

Also, in the second sequence, when Steps 1 to 5 are set as one cycle and the cycle is performed a predetermined number of times, in the respective steps in the first cycle, Step 1 of modifying the uppermost surface of the wafer 200 into a surface state in which the HCDS gas is easily adsorbed and Si is easily deposited, Step 2 of forming the first carbon-containing layer, and Step 3 of forming the silicon-containing layer are sequentially performed in this order. Here, the first carbon-containing layer formed in Step 2 is made a discontinuous layer, which covers only a portion of the uppermost surface of the wafer 200 which is modified. Also, Step 4 of supplying the $C_3H_6$ gas and Step 5 of supplying the $O_2$ gas are not performed between Steps 2 and 3. As Step 4 or 5 is not performed between Steps 2 and 3, the other portion (the exposed surface) of the uppermost surface of the wafer 200, which is not covered with the first carbon-containing layer, maintains a surface state in which the HCDS gas is easily adsorbed and Si is easily deposited. Accordingly, in Step 3, it is preferred to perform the adsorption of the HCDS gas or the deposition of Si onto the uppermost surface of the wafer 200, thereby facilitating the formation of the silicon-containing layer on the uppermost surface of the wafer 200.

Also, in the second sequence, when Steps 1 to 5 are set as one cycle and the cycle is performed a plurality of times, in the respective steps during and after the second cycle, Step 1 of modifying the uppermost surface of the fourth layer into a surface state in which the HCDS gas is easily adsorbed and Si is easily deposited, Step 2 of forming the first carbon-containing layer, and Step 3 of forming the silicon-containing layer are sequentially performed in this order. Here, the first carbon-containing layer formed in Step 2 is made a discontinuous layer, which covers only a portion of the uppermost surface of the fourth layer which is modified. Also, Step 4 of supplying the $C_3H_6$ gas and Step 5 of supplying the $O_2$ gas are not performed between Steps 2 and 3. As Step 4 or 5 is not performed between Steps 2 and 3, the other portion (the exposed surface) of the uppermost surface of the fourth layer, which is not covered with the first carbon-containing layer, maintains a surface state in which the HCDS gas is easily adsorbed and Si is easily deposited. Accordingly, in Step 3, it is preferred to perform the adsorption of the HCDS gas or the deposition of Si onto the uppermost surface of the fourth layer, thereby facilitating the formation of the silicon-containing layer on the uppermost surface of the fourth layer.

In this way, in either of the film forming sequences, it is possible to facilitate the formation of the silicon-containing layer on the uppermost surface of the wafer 200. As a result, even in a low temperature range, the film forming rate of the SiOCN film can be increased, thereby improving productivity of the film forming process.

(b) According to the embodiment, when the SiOCN film is formed, the $C_3H_6$ gas is allowed to be supplied twice per cycle (through the separate two steps). That is, in the first sequence, the $C_3H_6$ gas is allowed to be supplied twice before and after Step 2 in which the HCDS gas is supplied (i.e., in Steps 1 and 3). In addition, in the second sequence, the $C_3H_6$ gas is allowed to be supplied twice before and after Step 3 in which the HCDS gas is supplied (i.e., in Steps 2 and 4). Accordingly, it is possible to control the nitrogen (N) concentration and the carbon (C) concentration in the SiOCN film. For example, it is possible to increase the C concentration by reducing the N concentration in the SiOCN film.

(c) According to the embodiment, ratios of the respective element components, i.e., the silicon component, the oxygen component, the carbon component, and the nitrogen component, i.e., the silicon concentration, the oxygen concentration, the carbon concentration, and the nitrogen concentration, in the SiOCN film, can be adjusted and a composition ratio of the SiOCN film can be controlled by controlling the processing conditions such as the internal pressure of the process chamber or the gas supply time in each step of the respective sequences. In addition, according to the embodiment, since a SiOCN film having a predetermined composition can be formed, etching resistance, dielectric constant, and insulation resistance can be controlled, which makes it possible to form a silicon insulating film having a low dielectric constant, good etching resistance, and good insulation resistance as compared with a SiN film.

For example, in the first sequence, it is possible to control the amount of desorption of the $NH_3$ gas from the adsorption layer of the $NH_3$ gas formed on the modified uppermost surface of the wafer 200 (or the uppermost surface of the fourth layer) or the amount of adsorption of the $C_3H_6$ gas onto the modified uppermost surface of the wafer 200 (or the uppermost surface of the fourth layer) by controlling the gas supply time of the $C_3H_6$ gas in Step 1 or the partial pressure or concentration of the $C_3H_6$ gas in the process chamber 201 in Step 1. Accordingly, it is possible to finely adjust the N concentration and the C concentration in the SiOCN film. For example, it is possible to increase the amount of desorption of the $NH_3$ gas from the adsorption layer of the $NH_3$ gas formed on the modified uppermost surface of the wafer 200 (or the uppermost surface of the fourth layer) or to increase the amount of adsorption of the $C_3H_6$ gas onto the modified uppermost surface of the wafer 200 (or the uppermost surface of the fourth layer) by increasing the gas supply time of the $C_3H_6$ gas in Step 1 or increasing the partial pressure or concentration of the $C_3H_6$ gas in the process chamber 201 in Step 1. Accordingly, it is possible to increase the C concentration by reducing the N concentration in the SiOCN film.

Also, in the first sequence, it is possible to control the amount of adsorption of the $C_3H_6$ gas onto the uppermost surface of the wafer 200 (or the uppermost surface of the first layer) in Step 3 or the amount of oxidation in Step 4 by controlling the gas supply time of the $C_3H_6$ gas in Step 3 or the partial pressure or concentration of the $C_3H_6$ gas in the process chamber 201 in Step 3. Accordingly, it is possible to finely adjust the C concentration and the O concentration in the SiOCN film. For example, it is possible to properly perform the oxidation reaction in Step 4 since an appropriately exposed state of silicon in the surface of the second layer can be maintained by adjusting the gas supply time or the partial pressure or concentration of the $C_3H_6$ gas to a suitable value in Step 3 to make the adsorption of $C_3H_6$ onto the silicon-containing layer be appropriately unsaturated, i.e., to make the second carbon-containing layer be an appropriate discontinuous layer.

Also, in the second sequence, it is possible to control the amount of desorption of the $NH_3$ gas from the adsorption layer of the $NH_3$ gas formed on the modified uppermost surface of the wafer 200 (or the uppermost surface of the fourth layer) or the amount of adsorption of the $C_3H_6$ gas onto the modified uppermost surface of the wafer 200 (or the uppermost surface of the fourth layer) by controlling the gas supply time of the $C_3H_6$ gas in Step 2, or the partial pressure or concentration of the $C_3H_6$ gas in the process chamber 201 in Step 2. Accordingly, it is possible to finely adjust the N concentration and the C concentration in the SiOCN film. For example, it is possible to increase the amount of desorption of the $NH_3$ gas from the adsorption layer of the $NH_3$ gas formed on the modified uppermost surface of the wafer 200 (or the uppermost surface of the fourth layer) or to increase the amount of adsorption of the $C_3H_6$ gas onto the modified uppermost surface of the wafer 200 (or the uppermost surface of the fourth layer) by increasing the gas supply time of the $C_3H_6$ gas in Step 2 or increasing the partial pressure or concentration of the $C_3H_6$ gas in the process chamber 201 in Step 2. Accordingly, it is possible to increase the C concentration by reducing the N concentration in the SiOCN film.

Also, in the second sequence, it is possible to control the amount of adsorption of the $C_3H_6$ gas onto the uppermost surface of the wafer 200 (or the uppermost surface of the first layer) in Step 4 or the amount of oxidation in Step 5 by controlling the gas supply time of the $C_3H_6$ gas in Step 4 or the partial pressure or concentration of the $C_3H_6$ gas in the process chamber 201 in Step 4. Accordingly, it is possible to finely adjust the C concentration and the O concentration in the SiOCN film. For example, it is possible to properly perform the oxidation reaction in Step 5 since an appropriately exposed state of silicon in the surface of the second layer can be maintained by adjusting the gas supply time or the partial pressure or concentration of the $C_3H_6$ gas to a suitable value in Step 4 to make the adsorption of the $C_3H_6$ onto the silicon-containing layer be appropriately unsaturated, i.e., to make the second carbon-containing layer be an appropriate discontinuous layer.

Consequently, it is possible to appropriately control the O concentration, the C concentration, and the N concentration in the SiOCN film. For example, it is possible to increase the C concentration by reducing the N concentration while suppressing a reduction in the O concentration in SiOCN film. In addition, for example, even when the film forming temperature of the SiOCN film is lowered, it is possible to suppress an increase in the dielectric constant of the SiOCN film or reduce the dielectric constant of the SiOCN film.

Also, when increasing the gas supply time of the $C_3H_6$ gas in Step 3 of the first sequence or increasing the partial pressure or concentration of the $C_3H_6$ gas in the process chamber 201 in Step 3, the amount of silicon present in the surface of the second layer (the layer including the first carbon-containing layer, the silicon-containing layer and the second carbon-containing layer) is reduced to suppress the progress of the oxidation reaction of the second layer in Step 4. As a result, the oxygen (O) concentration in the SiOCN film tends to be reduced. Also, in the same way, even when increasing the gas supply time of $C_3H_6$ gas in Step 4 of the second sequence or increasing the partial pressure or concentration of the $C_3H_6$ gas in the process chamber 201 in Step 4, the amount of silicon present in the surface of the second layer (the layer including the first carbon-containing layer, the silicon-containing layer and the second carbon-containing layer) is reduced to suppress the oxidation reaction of the second layer in Step 5. As a result, the oxygen (O)

concentration in the SiOCN film tends to be reduced. Also, in such cases, it is difficult to reduce the nitrogen (N) concentration in the SiOCN film, and the carbon (C) concentration is difficult to increase by a large amount. That is, in these cases, it is difficult to reduce the dielectric constant of the SiOCN film.

(d) According to the embodiment, in either of the film forming sequences, when the process of forming the SiOCN film is completed, the step of supplying the $NH_3$ gas is performed at the end. That is, in the first film forming sequence, the activated $NH_3$ gas is supplied to the wafer 200 in Step 5 that is performed at the end of each cycle. Also, in the second film forming sequence, after the cycle including Steps 1 to 5 is performed a predetermined number of times, the nitriding step of supplying the activated $NH_3$ gas to the wafer 200 is performed. Accordingly, the uppermost surface of the SiOCN film can be appropriately nitrided to be modified, thereby making the finally formed SiOCN film a film having a uniform composition in the film thickness direction.

(e) According to the embodiment, it is possible to obtain the above-described effects without changing a structure of an existing substrate processing apparatus, film forming temperatures, types of gases, flow rates, and the like only by rearranging the supply order of the gases as in the above-described first or second sequence.

In addition, in an early stage of the studies, the inventors thought that if a layer having Si—C bonding was oxidized and then nitrided, not SiOCN but SiO or SiON would be formed. This is the reason why they thought that since Si—O bonding has bonding energy higher than the Si—N bonding or Si—C bonding, if a layer having the Si—C bonding is oxidized, the Si—C bonding of the layer having the Si—C bonding is broken when the Si—O bonding is formed in the oxidation process to desorb C, in which a bonding to Si is broken, from the layer having the Si—C bonding, and it is difficult to form the Si—N bonding even by nitriding the layer thereafter. Accordingly, it was thought that for example, if the supply order of the gases is rearranged as in the above-described first or second sequence, all C is desorbed, thereby making it impossible to form a SiOCN film (a SiO or SiON film is formed). However, as a result of repeated intensive studies, the inventors found that when a layer having the Si—C bonding is oxidized and then nitrided, it is possible to have C remained thereon, which is desorbed from the layer having the Si—C bonding by the oxidization, by controlling the oxidizing power (particularly, dilution rate, supply time, or partial pressure of an oxidizing gas) and also to properly form the Si—N bonding by the nitriding thereafter, whereby SiOCN can be appropriately formed. According to the film forming sequence of the embodiment, it is possible to obtain the above-described effects at low cost without much changing the existing substrate processing apparatus.

(f) According to the embodiment, a SiOCN film having a good in-plane uniformity of a film thickness of a wafer can be formed in either of the first and the second sequences. In addition, when a SiOCN film formed according to the first or second sequence of the embodiment is used as an insulating film, it is possible to provide an in-plane uniform performance of the SiOCN film and therefore to contribute to the improvement of performance of semiconductor devices or the improvement of production yield.

(g) In the surface modification step and Steps 1 to 5 of the first sequence or Steps 1 to 5 and the nitriding step of the second sequence according to the embodiment, the HCDS gas, the $C_3H_6$ gas, the $O_2$ gas, and the $NH_3$ gas supplied into the process chamber 201 are respectively activated by heat and supplied to the wafer 200. Accordingly, the above-described respective reactions can be softly performed, and thus, the formation of the silicon-containing layer, the formation of the carbon-containing layer, the oxidizing processing, and the nitriding processing can be easily performed with good controllability.

(h) When the silicon insulating film formed by the method of the embodiment is used as a sidewall spacer, a device forming technique having a small leak current and good machinability can be provided.

(i) When the silicon insulating film formed by the method of the embodiment is used as an etching stopper, a device forming technique having good machinability can be provided.

(j) According to the embodiment, the silicon insulating film having an ideal stoichiometric mixture ratio can be formed without using plasma. In addition, since the silicon insulating film can be formed without using plasma, the embodiment may be applied to a process having probability of plasma damage, for example, an SADP film of DPT.

Additional Embodiments of the Present Disclosure

Hereinabove, various embodiments of the present disclosure have been specifically described, but the present disclosure is not limited to the above-described embodiment, and may be variously modified without departing from the spirit of the present disclosure.

For example, although in the above-described first sequence, after the step of supplying the $NH_3$ gas (the surface modification step) is performed, the cycle including performing the step of forming the first carbon-containing layer by supplying the $C_3H_6$ gas (Step 1), the step of supplying the HCDS gas (Step 2), the step of forming the second carbon-containing layer by supplying the $C_3H_6$ gas (Step 3), the step of supplying the $O_2$ gas (Step 4), and the step of supplying the $NH_3$ gas (Step 5) in this order is performed a predetermined number of times, the present disclosure is not limited thereto. For example, as a modification of the first sequence is illustrated in FIG. 4B, after the surface modification step is performed, a cycle including performing Steps 1, 2, 4, 3 and 5 in this order may be performed a predetermined number of times. That is, the step of forming the second carbon-containing layer by supplying the carbon-containing gas (Step 3) and the step of supplying the oxidizing gas (Step 4) may be interchangeably performed, e.g., may be performed one prior to the other. However, the first sequence of FIG. 4A in which Step 3 is performed prior to Step 4 is preferable since it may increase the film forming rate as compared with the first sequence of FIG. 4B in which Step 4 is performed prior to Step 3.

Also, for example, although in the above-described second sequence, after the cycle including performing the step of supplying the $NH_3$ gas (Step 1), the step of forming the first carbon-containing layer by supplying the $C_3H_6$ gas (Step 2), the step of supplying the HCDS gas (Step 3), the step of forming the second carbon-containing layer by supplying the $C_3H_6$ gas (Step 4), and the step of supplying the $O_2$ gas (Step 5) in this order is performed a predetermined number of times, the step of supplying the $NH_3$ gas (the nitriding step) is performed, the present disclosure is not limited thereto. For example, as a modification of the second sequence is illustrated in FIG. 5B, a cycle including performing Steps 1, 2, 3, 5 and 4 in this order may be performed a predetermined number of times and then the nitriding step is performed. That is, the step of forming the second carbon-containing layer by supplying the carbon-containing gas (Step 4) and the step of supplying the oxidizing gas (Step 5) may be interchangeably performed, e.g., may be performed one prior to the other. However, the second sequence of FIG. 5A in which Step 4 is performed prior to Step 5 is preferable since it may increase the film forming rate as compared with the second sequence of FIG. 5B in which Step 5 is performed prior to Step 4.

Also, for example, the $NH_3$ gas may be directly supplied into the process chamber 201 through the fourth nozzle 249d without installing the buffer chamber 237 in the process chamber 201. In this case, if the gas supply holes 250d of the fourth nozzle 249d are configured to face the center of the reaction tube 203, the $NH_3$ gas can be directly supplied to the wafer 200 through the fourth nozzle 249d. In addition, only the buffer chamber 237 may be installed without installing the fourth nozzle 249d.

Moreover, for example, the $C_3H_6$ gas, the $O_2$ gas, and the $NH_3$ gas supplied into the process chamber 201 are not limited to being activated by heat, and they may be plasma-activated, for example. In this case, for example, using a plasma source as the above-described plasma generator, each gas may be plasma-excited. When each gas is plasma-excited and supplied, there is an advantage in that the film forming temperature can be more lowered. However, when each gas is not plasma-excited but activated by heat as in the above-described embodiment, to be supplied, there are advantages in that particles can be prevented from being generated in the process chamber 201 and plasma damage to members or the wafer 200 in the process chamber 201 can be avoided.

Further, for example, in Step 4 of the first sequence or Step 5 of the second sequence, a reducing gas such as a hydrogen-containing gas may be supplied along with the oxidizing gas. Under the processing conditions of the above-described embodiment, if the oxidizing gas and the reducing gas are supplied into the process chamber 201, which is under an atmosphere of less than atmospheric pressure (negative pressure), the oxidizing gas and the reducing gas react in the process chamber 201 to produce a moisture ($H_2O$)-free oxidizing species containing oxygen such as atomic oxygen, and the oxidizing species oxidizes each layer. In this case, the oxidation may occur with high oxidizing power as compared with a case in which only the oxidizing gas is used to oxidize the layers. Such oxidation is performed under a negative pressure atmosphere of non-plasma. The reducing gas may include, for example, hydrogen ($H_2$) gas.

In addition, for example, while an example in which the SiOCN film (semiconductor insulating film) containing silicon that is a semiconductor element is formed as the thin film has been described in the above-described embodiments, the present disclosure may be applied to an example in which a metal oxycarbonitride film (metal insulating film) containing a metal element, such as titanium (Ti), zirconium (Zr), hafnium (Hf), tantalum (Ta), aluminum (Al), molybdenum (Mo), gallium (Ga) and germanium (Ge), is formed.

For example, the present disclosure may be applied to the formation of a titanium oxycarbonitride film (TiOCN film), a zirconium oxycarbonitride film (ZrOCN film), a hafnium oxycarbonitride film (HfOCN film), a tantalum oxycarbonitride film (TaOCN film), an aluminum oxycarbonitride film (AlOCN film), a molybdenum oxycarbonitride film (MoOCN film), a gallium oxycarbonitride film (GaOCN film), a germanium oxycarbonitride film (GeOCN film), or a metal oxycarbonitride film of a combination or mixture thereof In this case, by using a precursor gas containing a metal element (a metal element-containing gas) such as a titanium precursor gas, a zirconium precursor gas, a hafnium precursor gas, a tantalum precursor gas, an aluminum precursor gas, a molybdenum precursor gas, a gallium precursor gas, a germanium precursor gas instead of the silicon precursor gas of the above-described embodiments, the film formation may be performed by the sequence (the first sequence, the second sequence or the modification thereof) of the above-described embodiments.

That is, in this case, after a step of supplying a nitriding gas to a wafer, a cycle including performing a step of supplying a carbon-containing gas to the wafer, a step of supplying a metal element-containing gas to the wafer, a step of supplying a carbon-containing gas to the wafer, a step of supplying a oxidizing gas to the wafer, and a step of supplying a nitriding gas to the wafer in this order is performed a predetermined number of times, thereby forming a thin film containing the metal element, oxygen, carbon and nitrogen (metal oxycarbonitride film) on the wafer.

Also, in this case, after a cycle including performing a step of supplying a nitriding gas to a wafer, a step of supplying a carbon-containing gas to the wafer, a step of supplying a metal element-containing gas to the wafer, a step of supplying a carbon-containing gas to the wafer, and a step of supplying a oxidizing gas to the wafer in this order may be performed a predetermined number of times, a step of supplying a nitriding gas to the wafer may be performed, thereby forming a thin film containing the metal element, oxygen, carbon and nitrogen (metal oxycarbonitride film) on the wafer.

For example, when a TiOCN film is formed as the metal oxycarbonitride film, a precursor containing Ti may include an organic precursor such as tetrakis(ethylmethylamino) titanium ($Ti[N(C_2H_5)(CH_3)]_4$, abbreviated to TEMAT), tetrakis(dimethylamino)titanium ($Ti[N(CH_3)_2]_4$, abbreviated to TDMAT), or tetrakis(diethylamino)titanium ($Ti[N(C_2H_5)_2]_4$, abbreviated to TDEAT), or an inorganic precursor such as titanium tetrachloride ($TiCl_4$). The gases of the above-described embodiments may be used as the carbon-containing gas, the oxidizing gas or the nitriding gas. In addition, although processing conditions in this case may be similar, for example, to the processing conditions of the above-described embodiments, it is more preferable that a wafer temperature be set to fall within a range of, for example, 100 to 500 degrees C. and an internal pressure of the process chamber be set to fall within a range of, for Example 1 to 3000 Pa.

Also, for example, when a ZrOCN film is formed as the metal oxycarbonitride film, a precursor containing Zr may include an organic precursor such as tetrakis(ethylmethylamino)zirconium ($Zr[N(C_2H_5)(CH_3)]_4$, abbreviated to TEMAZ), tetrakis(dimethylamino)zirconium ($Zr[N(CH_3)_2]_4$, abbreviated to TDMAZ), or tetrakis(diethylamino)zirconium ($Zr[N(C_2H_5)_2]_4$, abbreviated to TDEAZ), or an inorganic precursor such as zirconium tetrachloride ($ZrCl_4$). The gases of the above-described embodiments may be used as the carbon-containing gas, the oxidizing gas or the nitriding gas. In addition, although processing conditions in this case may be similar, for example, to the processing conditions of the above-described embodiments, it is more preferable that a wafer temperature be set to fall within a range of, for example, 100 to 400 degrees C. and an internal pressure of the process chamber be set to fall within a range of, for Example 1 to 3000 Pa.

In addition, for example, when a HfOCN film is formed as the metal oxycarbonitride film, a precursor containing Hf may include an organic precursor such as tetrakis(ethylmethylamino)hafnium (Hf[N(C$_2$H$_5$)(CH$_3$)]$_4$, abbreviated to TEMAH), tetrakis(dimethylamino)hafnium (Hf[N(CH$_3$)$_2$]$_4$, abbreviated to TDMAH), or tetrakis(diethylamino)hafnium (Hf[N(C$_2$H$_5$)$_2$]$_4$, abbreviated to TDEAH), or an inorganic precursor such as hafnium tetrachloride (HfCl$_4$). The gases of the above-described embodiments may be used as the carbon-containing gas, the oxidizing gas or the nitriding gas. In addition, although processing conditions in this case may be similar, for example, to the processing conditions of the above-described embodiments, it is more preferable that a wafer temperature be set to fall within a range of, for example, 100 to 400 degrees C. and an internal pressure of the process chamber be set to fall within a range of, for Example 1 to 3000 Pa.

Further, for example, when a TaOCN film is formed as the metal oxycarbonitride film, a precursor containing Ta may include an organic precursor such as tertiary-butylimino tris(diethylamino)tantalum (Ta[N(C$_2$H$_5$)$_2$]$_3$[NC(CH$_3$)$_3$], abbreviated to TB TDET), or tertiary-butylimino tris(ethylmethylamino)tantalum (Ta[NC(CH$_3$)$_3$][N(C$_2$H$_5$)CH$_3$]$_3$), abbreviated to TBTEMT), or an inorganic precursor such as tantalum pentachloride (TaCl$_5$). The gases of the above-described embodiments may be used as the carbon-containing gas, the oxidizing gas or the nitriding gas. In addition, although processing conditions in this case may be similar, for example, to the processing conditions of the above-described embodiments, it is more preferable that a wafer temperature be set to fall within a range of, for example, 100 to 500 degrees C. and an internal pressure of the process chamber be set to fall within a range of, for Example 1 to 3000 Pa.

Furthermore, for example, when a AlOCN film is formed as the metal oxycarbonitride film, a precursor containing Al may include an organic precursor such as trimethyl aluminum (Al(CH$_3$)$_3$, abbreviated to TMA), or an inorganic precursor such as trichloro aluminum (AlCl$_3$). The gases of the above-described embodiments may be used as the carbon-containing gas, the oxidizing gas or the nitriding gas. In addition, although processing conditions in this case may be similar, for example, to the processing conditions of the above-described embodiments, it is more preferable that a wafer temperature be set to fall within a range of, for example, 100 to 400 degrees C. and an internal pressure of the process chamber be set to fall within a range of, for Example 1 to 3000 Pa.

Moreover, for example, when a MoOCN film is formed as the metal oxycarbonitride film, a precursor containing Mo may include an in organic precursor such as molybdenum pentachloride (MoCl$_5$). The gases of the above-described embodiments may be used as the carbon-containing gas, the oxidizing gas or the nitriding gas. In addition, although processing conditions in this case may be similar, for example, to the processing conditions of the above-described embodiments, it is more preferable that a wafer temperature be set to fall within a range of, for example, 100 to 500 degrees C. and an internal pressure of the process chamber be set to fall within a range of, for Example 1 to 3000 Pa.

As described above, the present disclosure may also be applied to formation of the metal oxycarbonitride film, in which case functional effects similar to the above-described embodiments are obtained. That is, the present disclosure may be applied to a case in which the oxycarbonitride film containing a predetermined element such as a semiconductor element or a metal element is formed.

Moreover, while an example in which the thin film is formed using a batch type substrate processing apparatus in which a plurality of substrates are processed at a time has been described, the present disclosure is not limited thereto but may be applied to a case in which the thin film is formed using a single-wafer type substrate processing apparatus in which one or several substrates are processed at a time.

Moreover, the film forming sequences of the above-described embodiments, the modifications, the application examples and the like may be appropriately combined and used.

In addition, the present disclosure is implemented by modifying, for example, an existing process recipe of the substrate processing apparatus. When the process recipe is modified, the process recipe according to the present disclosure may be installed to the existing substrate processing apparatus through an electrical communication line or a recording medium in which the process recipe is recorded, or the process recipe itself may be changed to the process recipe according to the present disclosure by manipulating an input/output device of the existing substrate processing apparatus.

EXAMPLES

Example 1

As an example of the present disclosure, a SiOCN film was formed on a wafer by the first sequence of the above-described embodiment using the substrate processing apparatus of the above-described embodiment. FIG. 6A is a view illustrating gas supply timings in this example. The HCDS gas was used as the silicon-containing gas, the C$_3$H$_6$ gas was used as the carbon-containing gas, the O$_2$ gas was used as the oxidizing gas, and the NH$_3$ gas was used as the nitriding gas. The gas supply time of the C$_3$H$_6$ gas in Step 1 of forming a first carbon-containing layer was varied within the processing range described in the above-described embodiment to manufacture four types of samples. The other processing conditions were set to fall within a range of the processing conditions described in the above-described embodiment. In addition, for each sample manufactured, an oxygen (O) concentration, a nitrogen (N) concentration, and a carbon (C) concentration in the SiOCN film were respectively measured.

Figure 7:
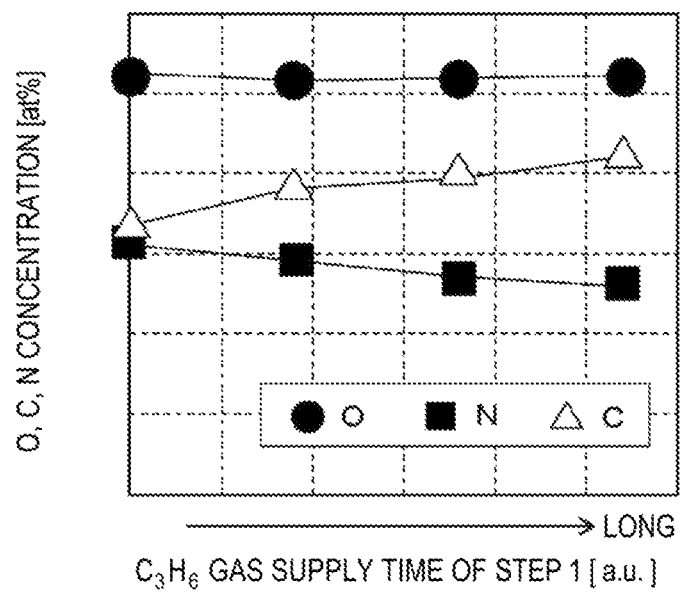
FIG. 7 is a view showing evaluation results of a composition of a SiOCN film in Example 1.

FIG. 7 is a graph showing measurement results of the O, N and C concentrations of the SiOCN film in Example 1. The vertical axis of FIG. 7 represents the O, N and C concentrations (at %) in the film, and the transverse axis represents the gas supply time (a.u.) of the C$_3$H$_6$ gas. In the graph, the mark "●" represents the O concentration in the film, the mark "■" represents the N concentration in the film, and the mark "Δ" represents the C concentration in the film. Referring to FIG. 7, even when the gas supply time of the C$_3$H$_6$ gas was increased in Step 1, it can be seen that the O concentration in the SiOCN film is hardly changed. In addition, it can be seen that the N concentration in the SiOCN film is reduced and the C concentration is increased by increasing the gas supply time of the C$_3$H$_6$ gas in Step 1. That is, it can be seen that the dielectric constant of the SiOCN film can be reduced by increasing the gas supply time of the C$_3$H$_6$ gas in Step 1. That is, it can be seen that the N and C concentrations in the SiOCN film can be controlled (finely adjusted) by controlling the gas supply time of the $C_3H_6$ gas in Step 1, thereby controlling (finely adjusting) the dielectric constant of the SiOCN film.

Example 2

As an example of the present disclosure, a SiOCN film was formed on a wafer by the first sequence of the above-described embodiment using the substrate processing apparatus of the above-described embodiment. FIG. 6A is a view illustrating gas supply timings in this example. The HCDS gas was used as the silicon-containing gas, the $C_3H_6$ gas was used as the carbon-containing gas, the $O_2$ gas was used as the oxidizing gas, and the $NH_3$ gas was used as the nitriding gas. The processing conditions in each step were set to fall within a range of the processing conditions described in the above-described embodiment. In addition, O, N and C concentrations in the SiOCN film formed on the wafer were respectively measured.

In addition, as a first comparative example, using the substrate processing apparatus of the above-described embodiment, after a surface modification step of supplying the $NH_3$ gas to a wafer was performed, a cycle including performing Step 1 of supplying the hydrogen ($H_2$) gas to the wafer, Step 2 of supplying the HCDS gas to the wafer, Step 3 of supplying the $C_3H_6$ gas to wafer, Step 4 of supplying the $O_2$ gas to the wafer, and Step 5 of supplying the $NH_3$ gas to the wafer in this order was performed a predetermined number of times, thereby forming a SiOCN film on the wafer. The first comparative example was different from Example 2 only in that the gas used in Step 1 was replaced with the $H_2$ gas, and the processing conditions in each step were set to be equal to the processing conditions in each step of Example 2. In addition, O, N and C concentrations in the SiOCN film formed on the wafer were respectively measured.

In addition, as a second comparative example, using the substrate processing apparatus of the above-described embodiment, after a surface modification step of supplying the $NH_3$ gas to a wafer was performed, a cycle including performing Step 1 of supplying the nitrogen ($N_2$) gas to the wafer, Step 2 of supplying the HCDS gas to the wafer, Step 3 of supplying the $C_3H_6$ gas to wafer, Step 4 of supplying the $O_2$ gas to the wafer, and Step 5 of supplying the $NH_3$ gas to the wafer in this order was performed a predetermined number of times, thereby forming a SiOCN film on the wafer. The second comparative example was different from Example 2 only in that the gas used in Step 1 was replaced with the $N_2$ gas, and the processing conditions in each step were set to be equal to the processing conditions in each step of Example 2. In addition, O, N and C concentrations in the SiOCN film formed on the wafer were respectively measured.

Figure 8:
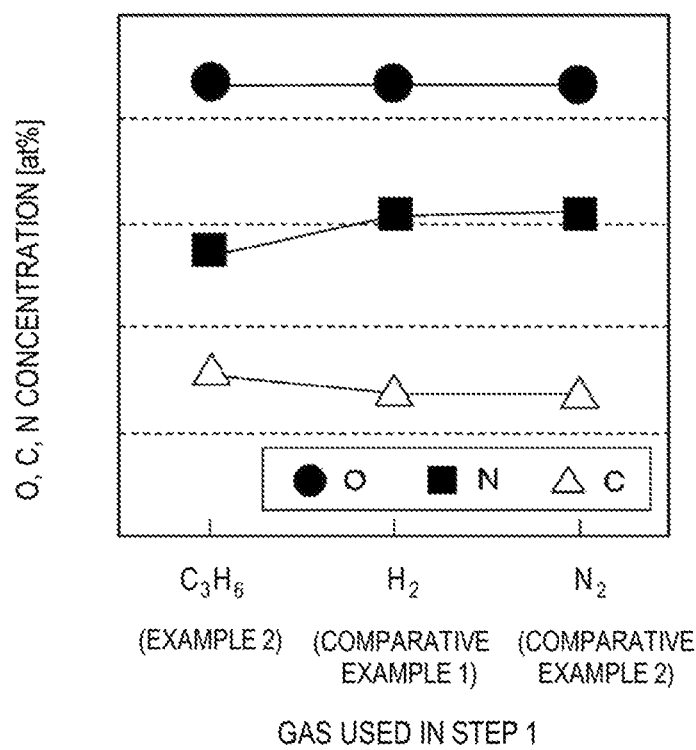
FIG. 8 is a view showing evaluation results of a composition of a SiOCN film in Example 2.

FIG. 8 is a graph showing measurement results of the O, N and C concentrations of the SiOCN film in Example 2 and the first and second comparative examples. The vertical axis of FIG. 8 represents the O, N and C concentrations (at %) in the film, and the transverse axis represents the types of the gases used in Step 1. In the graph, the mark "●" represents the O concentration in the film, the mark "■" represents the N concentration in the film, and the mark "Δ" represents the C concentration in the film. Referring to FIG. 8, it can be seen that the O concentration in the film in Example 2 is not changed as compared with the O concentration in the film in each comparative example. In addition, it can be seen that the N concentration in the film in Example 2 is low as compared with the N concentration in the film in each comparative example. Also, it can be seen that the C concentration in the film in Example 2 is high as compared with the C concentration in the film in each the comparative example. That is, it can be seen that if the $C_3H_6$ gas is used in Step 1, it is possible to increase the C concentration in the film by reducing the N concentration in the film while suppressing a reduction in the O concentration in the SiOCN film, whereby the dielectric constant of the SiOCN film can be reduced. That is, it can be seen that if the $C_3H_6$ gas is used in Step 1, the N and C concentrations in the SiOCN film can be controlled (finely adjusted).

Reference Example 1

Figure 6B:
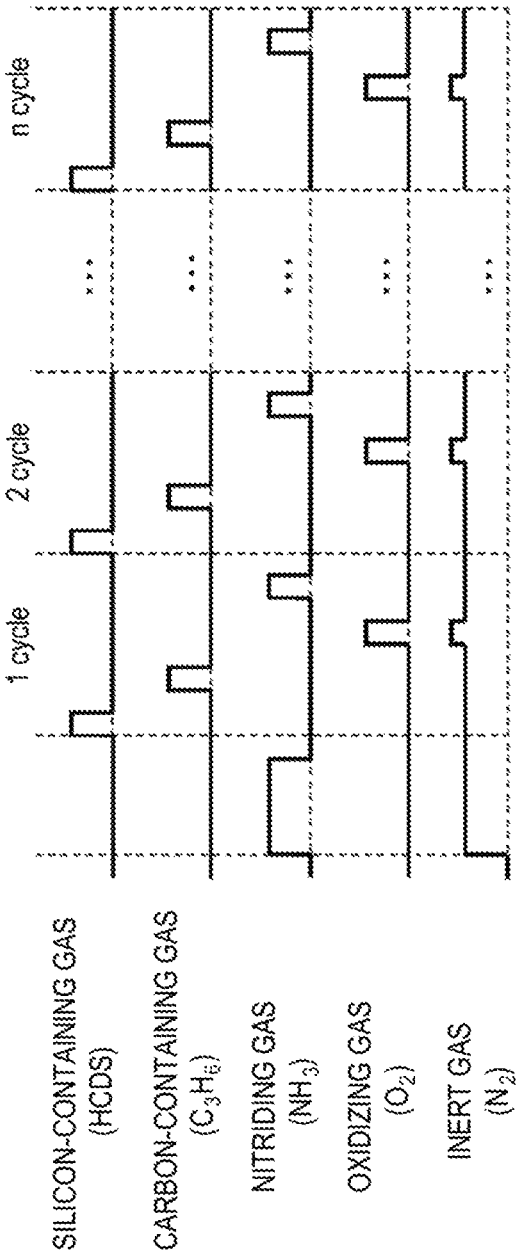

As Reference Example 1, using the substrate processing apparatus of the above-described embodiment, after a surface modification step of supplying the $NH_3$ gas to a wafer was performed, a cycle including performing Step 1a of supplying the HCDS gas to the wafer, Step 2a of supplying the $C_3H_6$ gas to wafer, Step 3a of supplying the $O_2$ gas to the wafer, and Step 4a of supplying the $NH_3$ gas to the wafer in this order was performed a predetermined number of times, thereby forming a SiOCN film on the wafer. FIG. 6B is a view illustrating gas supply timings in Reference Example 1. Reference Example 1 was different from the first sequence of the above-described embodiment only in that Step 1 of forming the first carbon-containing layer was not performed. A processing sequence or processing conditions in Steps 1a to 4a of Reference Example 1 were set to be similar to the processing sequence or processing conditions in Steps 2 to 5 of the first sequence of the above-described embodiment. In addition, the wafer temperature (film forming temperature) when a film was formed was varied between 550 to 630 degrees C. to manufacture three types of samples, and O, N and C concentrations in the SiOCN film formed on the wafer were respectively measured.

Figure 9:
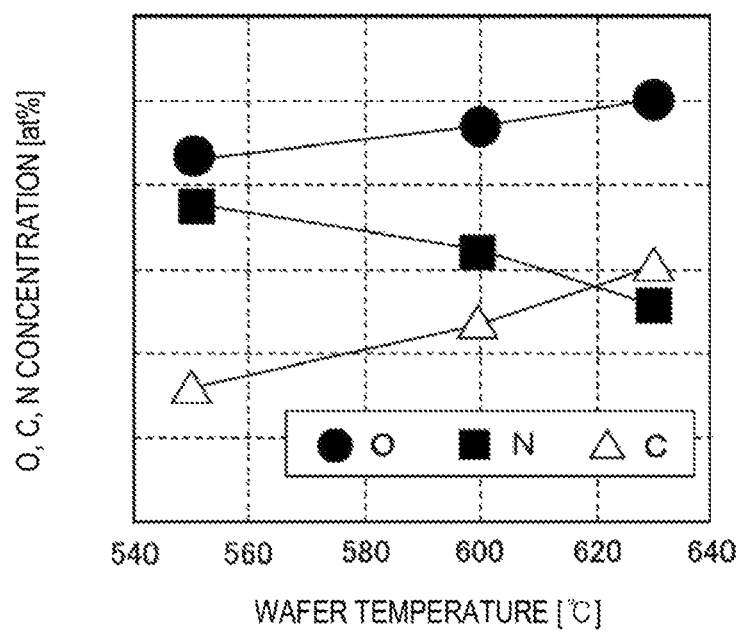
FIG. 9 is a view showing evaluation results of a composition of a SiOCN film in Reference Example 1.

FIG. 9 is a graph showing measurement results of the O, N and C concentrations of the SiOCN film in Reference Example 1. The vertical axis of FIG. 9 represents the O, N and C concentrations (at %) in the film, and the transverse axis represents the wafer temperature. In the graph, the mark "●" represents the O concentration in the film, the mark "■" represents the N concentration in the film, and the mark "Δ" represents the C concentration in the film. Referring to FIG. 9, it can be seen that if the film forming temperature is lowered, the O and C concentrations in the SiOCN film are respectively reduced and the N concentration is increased. That is, if the film forming temperature is lowered, a composition of the SiOCN film approaches that of the SiN film, and thus, the dielectric constant of the SiOCN film is increased.

Reference Example 2

As Reference Example 2, using the substrate processing apparatus of the above-described embodiment, a SiOCN film was formed on a wafer by a film forming sequence similar to Reference Example 1. Reference Example 2 was different from the first sequence of the above-described embodiment only in that Step 1 of forming the first carbon-containing layer was not performed as in Reference Example 1. A processing sequence or processing conditions in Steps 1a to 4a of Reference Example 2 were set to be similar to the processing sequence or processing conditions in Steps 2 to 5 of the first sequence of the above-described embodiment. In addition, the gas supply time of the $C_3H_6$ gas in Step 2a was varied to manufacture three types of samples, and O, N and C concentrations in the SiOCN film formed on the wafer were respectively measured.

Figure 10:
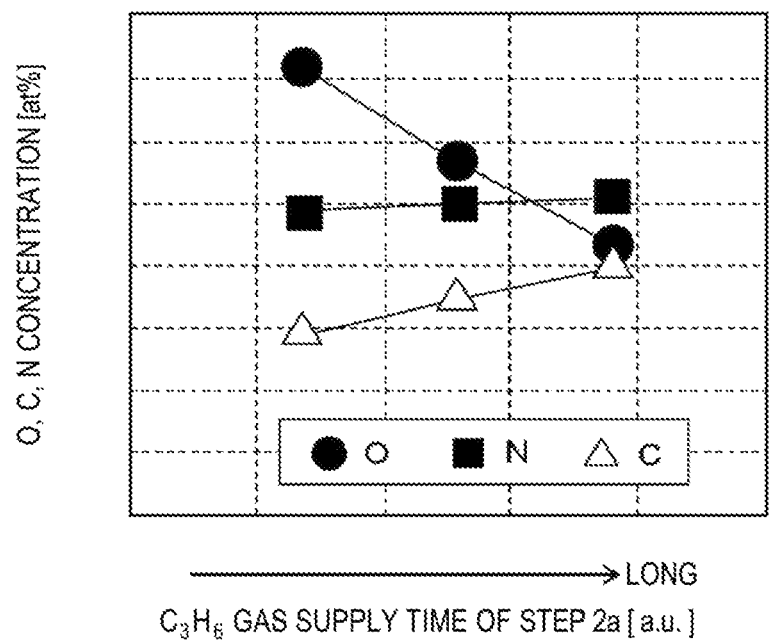
FIG. 10 is a view showing evaluation results of a composition of a SiOCN film in Reference Example 2.

FIG. 10 is a graph showing measurement results of the O, N and C concentrations of the SiOCN film in Reference Example 2. The vertical axis of FIG. 10 represents the O, N and C concentrations (at %) in the film, and the transverse axis represents the gas supply time (a.u.) of the $C_3H_6$ gas. In the graph, the mark "●" represents the O concentration in the film, the mark "■" represents the N concentration in the film, and the mark "Δ" represents the C concentration in the film. Referring to FIG. 10, it can be seen that if the gas supply time of the $C_3H_6$ gas in Step 2a is increased, the O concentration in the SiOCN film is reduced. It can also be seen that even when the gas supply time of the $C_3H_6$ gas in Step 2a is increased, the N concentration in the SiOCN film is not reduced, and the C concentration ends up in a slight increase. That is, it can be seen that in the film forming sequence shown in FIG. 6B, since the N concentration in the SiOCN film cannot be reduced even when the gas supply time of the $C_3H_6$ gas in Step 2a is increased, an drastic increase in the C concentration cannot be expected, and thus, it is difficult to reduce the dielectric constant of the SiOCN film.

<Further Additional Aspects of the Present Disclosure>

Hereinafter, some aspects of the present disclosure will be additionally stated.

According to an aspect of the present disclosure, there is provided a method of manufacturing a semiconductor device, including forming a thin film containing a predetermined element, oxygen, carbon, and nitrogen on a substrate by performing a cycle a predetermined number of times after supplying a nitriding gas to the substrate, the cycle including performing the following steps in the following order:
supplying a carbon-containing gas to the substrate;
supplying a predetermined element-containing gas to the substrate;
supplying the carbon-containing gas to the substrate;
supplying an oxidizing gas to the substrate; and
supplying the nitriding gas to the substrate.

In some embodiments, in the act of forming the thin film, an uppermost surface of the substrate is modified by supplying the nitriding gas to the substrate before the cycle is performed a predetermined number of times.

In some embodiments, in the act of forming the thin film, a first carbon-containing layer is formed in a portion of the uppermost surface by supplying the carbon-containing gas to the substrate; a predetermined element-containing layer is formed on the uppermost surface modified by the nitriding gas and having the first carbon-containing layer formed in the portion thereof by supplying the predetermined element-containing gas to the substrate; a second carbon-containing layer is formed on the predetermined element-containing layer by supplying the carbon-containing gas to the substrate; a layer containing the predetermined element, oxygen and carbon is formed by supplying the oxidizing gas to the substrate to oxidize a layer including the first carbon-containing layer, the predetermined element-containing layer and the second carbon-containing layer; and a layer containing the predetermined element, oxygen, carbon and nitrogen is formed and an uppermost surface thereof is modified by supplying the nitriding gas to the substrate to nitride the layer containing the predetermined element, oxygen and carbon.

In some embodiments, the first carbon-containing layer is formed by adsorbing the carbon-containing gas onto the portion of the uppermost surface modified by the nitriding gas.

In some embodiments, at least a portion of the first carbon-containing layer is formed by substituting the carbon-containing gas for a portion of the nitriding gas adsorbed onto at least a portion of the uppermost surface modified by the nitriding gas.

According to another aspect of the present disclosure, there is provided a method of manufacturing a semiconductor device, including forming a thin film containing a predetermined element, oxygen, carbon, and nitrogen on a substrate by performing a cycle a predetermined number of times, the cycle including performing the following steps in the following order:
supplying a nitriding gas to the substrate
supplying a carbon-containing gas to the substrate;
supplying a predetermined element-containing gas to the substrate;
supplying the carbon-containing gas to the substrate; and
supplying an oxidizing gas to the substrate.

In some embodiments, the act of forming the thin film further includes supplying the nitriding gas to the substrate after performing the cycle a predetermined number of times.

According to still another aspect of the present disclosure, there is provided a method of manufacturing a semiconductor device, including forming a thin film containing a predetermined element, oxygen, carbon, and nitrogen on a substrate by performing a cycle a predetermined number of times and then supplying a nitriding gas to the substrate, the cycle including performing the following steps in the following order:
supplying the nitriding gas to the substrate;
supplying a carbon-containing gas to the substrate;
supplying a predetermined element-containing gas to the substrate;
supplying the carbon-containing gas to the substrate; and
supplying an oxidizing gas to the substrate.

In some embodiments, the predetermined element includes a semiconductor element or a metal element.

In some embodiments, the predetermined element is silicon.

According to yet another aspect of the present disclosure, there is provided a method of processing a substrate, including forming a thin film containing a predetermined element, oxygen, carbon, and nitrogen on a substrate by performing a cycle a predetermined number of times after supplying a nitriding gas to the substrate, the cycle including performing the following steps in the following order:
supplying a carbon-containing gas to the substrate;
supplying a predetermined element-containing gas to the substrate;
supplying the carbon-containing gas to the substrate;
supplying an oxidizing gas to the substrate; and
supplying the nitriding gas to the substrate.

According to yet another aspect of the present disclosure, there is provided a substrate processing apparatus, including:
a process chamber configured to accommodate a substrate;
a predetermined element-containing gas supply system configured to supply a predetermined element-containing gas to the substrate in the process chamber;
a carbon-containing gas supply system configured to supply a carbon-containing gas to the substrate in the process chamber;
an oxidizing gas supply system configured to supply an oxidizing gas to the substrate in the process chamber;
a nitriding gas supply system configured to supply a nitriding gas to the substrate in the process chamber; and a control unit configured to control the predetermined element-containing gas supply system, the carbon-containing gas supply system, the oxidizing gas supply system and the nitriding gas supply system such that a thin film containing the predetermined element, oxygen, carbon, and nitrogen is formed on the substrate in the process chamber by performing a cycle a predetermined number of times after supplying the nitriding gas to the substrate in the process chamber, the cycle including performing the following steps in the following order: supplying the carbon-containing gas to the substrate in the process chamber; supplying the predetermined element-containing gas to the substrate in the process chamber; supplying the carbon-containing gas to the substrate in the process chamber; supplying the oxidizing gas to the substrate in the process chamber; and supplying the nitriding gas to the substrate in the process chamber.

According to yet another aspect of the present disclosure, there is provided a program that causes a computer to perform a process of forming a thin film containing a predetermined element, oxygen, carbon, and nitrogen on a substrate in a process chamber by performing a cycle a predetermined number of times after supplying a nitriding gas to the substrate in the process chamber, the cycle including performing the following steps in the following order:

supplying a carbon-containing gas to the substrate in the process chamber;

supplying a predetermined element-containing gas to the substrate in the process chamber;

supplying the carbon-containing gas to the substrate in the process chamber;

supplying an oxidizing gas to the substrate in the process chamber; and supplying the nitriding gas to the substrate in the process chamber.

According to yet another aspect of the present disclosure, there is provided a non-transitory computer-readable recording medium storing a program that causes a computer to perform a process of forming a thin film containing a predetermined element, oxygen, carbon, and nitrogen on a substrate in a process chamber by performing a cycle a predetermined number of times after supplying a nitriding gas to the substrate in the process chamber, the cycle including performing the following steps in the following order:

supplying a carbon-containing gas to the substrate in the process chamber;

supplying a predetermined element-containing gas to the substrate in the process chamber;

supplying the carbon-containing gas to the substrate in the process chamber;

supplying an oxidizing gas to the substrate in the process chamber; and supplying the nitriding gas to the substrate in the process chamber.

According to a method of manufacturing a semiconductor device, a substrate processing apparatus and a recording medium of the present disclosure, it is possible to suppress a reduction in film forming rate and an increase in dielectric constant when a thin film containing a predetermined element, oxygen, carbon and nitrogen is formed in a low temperature range.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising forming a thin film containing a predetermined element, oxygen, carbon, and nitrogen on a substrate by performing a cycle once or more, the cycle comprising performing the following:

(a) supplying a carbon-containing gas to the substrate;

(b) supplying a predetermined element-containing gas to the substrate, the predetermined element including a semiconductor element or a metal element;

(c) supplying an oxidizing gas to the substrate; and (d) supplying a nitriding gas to the substrate, wherein in the (a), a first carbon-containing layer is formed directly on a portion of an uppermost surface of the substrate, wherein in the (b), a predetermined element-containing layer is formed directly on the uppermost surface of the substrate, which has the first carbon-containing layer formed on the portion thereof, and wherein the cycle further comprises, after the (b) is performed, (e) supplying a carbon-containing gas to the substrate.

2. The method of claim 1, wherein the cycle comprises performing the (a), the (b), the (e), the (c), and the (d) in this order.

3. The method of claim 1, wherein the cycle comprises performing the (a), the (b), the (c), the (e), and the (d) in this order.

4. The method of claim 1, wherein before the cycle is performed once or more, the (d) is performed.

5. The method of claim 4, wherein a nitriding gas supply time in the (d) performed before the cycle is performed once or more is set to be longer than a nitriding gas supply time in the (d) performed during the cycle.

6. The method of claim 1, wherein the carbon-containing gas, the predetermined element-containing gas, the oxidizing gas, and the nitriding gas are respectively activated by heat and supplied to the substrate.

7. The method of claim 1, wherein at least one among the carbon-containing gas, the predetermined element-containing gas, the oxidizing gas, and the nitriding gas is plasma-activated and supplied to the substrate.

8. The method of claim 1, wherein in the (c), a reducing gas is supplied to the substrate along with the oxidizing gas.

9. The method of claim 1, wherein the predetermined element includes silicon.

10. The method of claim 1, wherein the predetermined element is at least one selected from a group consisting of Si, Ge, Ti, Zr, Hf, Ta, Al, Mo, and Ga.

11. A non-transitory computer-readable recording medium storing a program that causes a computer to perform a process of forming a thin film containing a predetermined element, oxygen, carbon, and nitrogen on a substrate by performing a cycle once or more, the cycle comprising performing the following:

(a) supplying a carbon-containing gas to the substrate;

(b) supplying a predetermined element-containing gas to the substrate, the predetermined element including a semiconductor element or a metal element;

(c) supplying an oxidizing gas to the substrate; and (d) supplying a nitriding gas to the substrate, wherein in the (a), a first carbon-containing layer is formed directly on a portion of an uppermost surface of the substrate, wherein in the (b), a predetermined element-containing layer is formed directly on the uppermost surface of the substrate, which has the first carbon-containing layer formed on the portion thereof, and wherein the cycle further comprises, after the (b) is performed, (e) supplying a carbon-containing gas to the substrate.

* * * * *